(12) United States Patent
Ross et al.

(10) Patent No.: US 10,624,241 B1
(45) Date of Patent: Apr. 14, 2020

(54) RACK MOUNTABLE THERMAL REGULATION SYSTEM

(71) Applicant: Amazon Technologies, Inc., Seattle, WA (US)

(72) Inventors: Peter George Ross, Olympia, WA (US); Christopher Strickland Beall, Woodinville, WA (US); Felipe Enrique Ortega Gutierrez, Tacoma, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 356 days.

(21) Appl. No.: 14/876,602

(22) Filed: Oct. 6, 2015

(51) Int. Cl.
*H05K 7/20* (2006.01)
(52) U.S. Cl.
CPC .................. *H05K 7/20736* (2013.01)
(58) Field of Classification Search
CPC ........... H05K 7/20736; H05K 7/20145; H05K 7/20718; H05K 7/20209; H05K 7/20536; H05K 7/20618
See application file for complete search history.

(56) References Cited

U.S. PATENT DOCUMENTS

| | | | |
|---|---|---|---|
| 5,769,159 A * | 6/1998 | Yun | F28F 27/00 165/276 |
| 5,871,396 A | 2/1999 | Shen | |
| 6,149,065 A * | 11/2000 | White | F23N 1/007 236/15 A |
| 6,259,605 B1 | 7/2001 | Schmitt | |
| 6,468,054 B1 * | 10/2002 | Anthony | F04D 25/12 417/360 |
| 6,545,850 B1 | 4/2003 | Shearman et al. | |
| 6,587,340 B2 * | 7/2003 | Grouell | H05K 7/2019 165/122 |
| 6,603,661 B2 | 8/2003 | Smith et al. | |
| 6,621,693 B1 | 9/2003 | Potter et al. | |
| 6,675,976 B2 | 1/2004 | Steinman et al. | |

(Continued)

OTHER PUBLICATIONS

International Search Report for PCT/US2011/051139, dated Dec. 6, 2011, Amazon Technologies, Inc., pp. 1-10.

(Continued)

*Primary Examiner* — Mukundbhai G Patel
(74) *Attorney, Agent, or Firm* — Robert C. Kowert; Kowert, Hood, Munyon, Rankin & Goetzel, P.C.

(57) ABSTRACT

A server rack comprises a plurality of slots and a plurality of computing devices. Individual ones of the computing devices are mounted within individual ones of the slots. The server rack also comprises a plurality of slot-level thermal regulation systems. At least one of the slot-level thermal regulation systems comprises a louver corresponding to a particular slot and located between a particular computing device mounted within the particular slot and at least one fan configured to facilitate airflow through the server rack. The louver is configured to regulate airflow through the particular computing device. The at least one slot-level thermal regulation system further comprises a thermally activated unit located in an exhaust flow of the particular computing device and configured to change the angle of the louver in response to a change in thermal energy of the exhaust flow.

20 Claims, 12 Drawing Sheets

(56) References Cited

U.S. PATENT DOCUMENTS

| | | | |
|---|---|---|---|
| 6,791,836 B2* | 9/2004 | Cipolla | G06F 9/52 165/80.3 |
| 6,795,314 B1 | 9/2004 | Arbogast et al. | |
| 6,822,859 B2 | 11/2004 | Coglitore et al. | |
| 6,991,533 B2* | 1/2006 | Tsai | H05K 7/2019 361/695 |
| 7,031,154 B2* | 4/2006 | Bash | H05K 7/20718 165/80.3 |
| 7,042,722 B2 | 5/2006 | Suzuki et al. | |
| 7,068,509 B2 | 6/2006 | Bash et al. | |
| 7,238,104 B1 | 7/2007 | Greenslade et al. | |
| 7,272,732 B2* | 9/2007 | Farkas | G06F 1/206 713/300 |
| 7,283,358 B2 | 10/2007 | Campbell et al. | |
| 7,286,345 B2* | 10/2007 | Casebolt | H05K 7/20736 361/679.48 |
| 7,379,299 B2 | 5/2008 | Walsh et al. | |
| 7,403,390 B2 | 7/2008 | Franz et al. | |
| 7,508,663 B2* | 3/2009 | Coglitore | H05K 7/20736 165/122 |
| 7,599,183 B2 | 10/2009 | Dittus et al. | |
| 7,660,116 B2 | 2/2010 | Claassen et al. | |
| 7,701,710 B2 | 4/2010 | Tanaka et al. | |
| 7,719,835 B1 | 5/2010 | Schluter | |
| 7,862,410 B2 | 1/2011 | McMahan et al. | |
| 7,869,210 B2 | 1/2011 | Moss | |
| 7,990,700 B2 | 8/2011 | Guo | |
| 8,080,909 B2* | 12/2011 | Perkins | B60K 6/48 310/52 |
| 8,154,870 B1* | 4/2012 | Czamara | H05K 7/20736 361/694 |
| 8,248,793 B2* | 8/2012 | Bash | H05K 7/20609 312/236 |
| 8,472,183 B1 | 6/2013 | Ross et al. | |
| 8,477,491 B1 | 7/2013 | Ross et al. | |
| 8,720,532 B2* | 5/2014 | Malone | H05K 7/20727 165/121 |
| 8,824,137 B2* | 9/2014 | Nakayama | G11B 33/142 312/223.2 |
| 8,873,235 B2* | 10/2014 | Chen | H05K 7/20736 361/694 |
| 9,084,374 B2* | 7/2015 | Korikawa | H05K 7/20145 |
| 2004/0217072 A1* | 11/2004 | Bash | H05K 7/20736 211/26 |
| 2004/0218355 A1 | 11/2004 | Bash et al. | |
| 2004/0233643 A1 | 11/2004 | Bolich et al. | |
| 2005/0166860 A1 | 8/2005 | Austin et al. | |
| 2005/0237716 A1 | 10/2005 | Chu et al. | |
| 2005/0241810 A1* | 11/2005 | Malone | H05K 7/20727 165/122 |
| 2006/0039108 A1* | 2/2006 | Chikusa | G06F 1/20 361/695 |
| 2006/0274496 A1 | 12/2006 | Lee | |
| 2008/0013275 A1 | 1/2008 | Beckley et al. | |
| 2008/0112127 A1 | 5/2008 | June | |
| 2008/0285232 A1 | 11/2008 | Claassen et al. | |
| 2009/0086441 A1 | 4/2009 | Randall et al. | |
| 2009/0262499 A1* | 10/2009 | Chou | H05K 7/20172 361/695 |
| 2012/0092811 A1 | 4/2012 | Chapel et al. | |
| 2013/0083481 A1* | 4/2013 | Goto | H05K 7/20209 361/695 |
| 2014/0168887 A1* | 6/2014 | Lai | H05K 7/20736 361/679.46 |
| 2016/0165760 A1* | 6/2016 | Kutsuzawa | H05K 7/20736 361/679.5 |

OTHER PUBLICATIONS

U.S. Appl. No. 12/886,440, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
Office Action from U.S. Appl. No. 12/886,437, dated May 29, 2012, Peter G. Ross, pp. 1-7.
U.S. Appl. No. 12/886,437, filed Sep. 20, 2010, Peter G. Ross.
Office Action from U.S. Appl. No. 12/886,440, dated May 30, 2012, Peter G. Ross, pp. 1-8.
Office Action from U.S. Appl. No. 12/886,472, dated May 30, 2012, Peter G. Ross, pp. 1-8.
Armstrong, Models OB-30 and OB-31, "Temperature Regulators—Installation—Set-up and Adjusting Procedure," IOM-1113-A, downloaded from www.armstrong-eu.com on Aug. 3, 2015, pages.
U.S. Appl. No. 14/876,597, filed Oct. 6, 2015, Peter G. Ross, et al.
U.S. Appl. No. 14/868,280, filed Sep. 28, 2015, Peter G. Ross, et al.
U.S. Appl. No. 13/874,367, filed Dec. 18, 2013, Peter G. Panchapakesan et al.
Clad Metal from Engineered Materials Solutions, "How Thermostat Metal Works," downloaded from http://www.emsclad.com/tech.html/ on Aug. 3, 2015, pp. 1-6.
Robertshaw Industrial Products Division, "Instruction Manual No. P-2057," Feb. 1991, pp. 1-8.

* cited by examiner

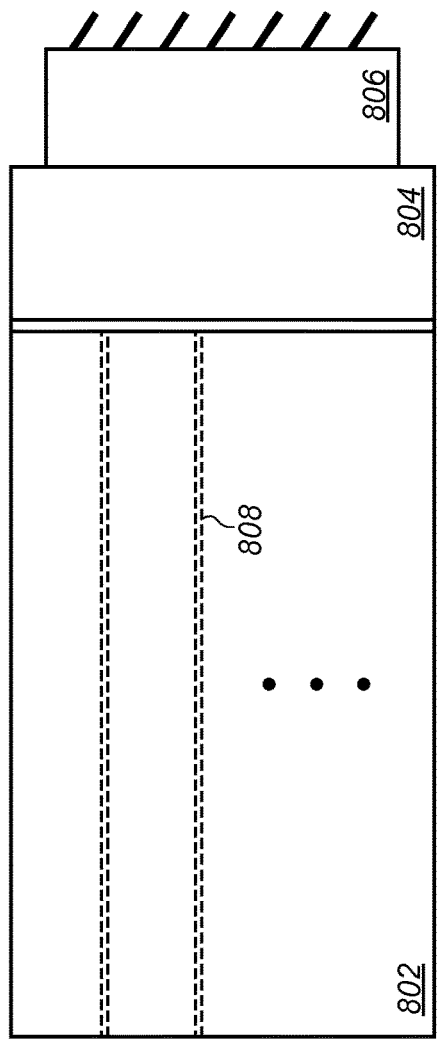
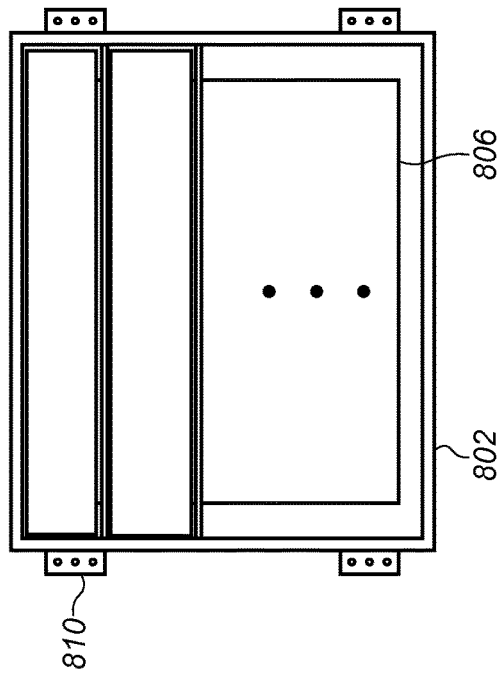
FIG. 8B
FIG. 8A

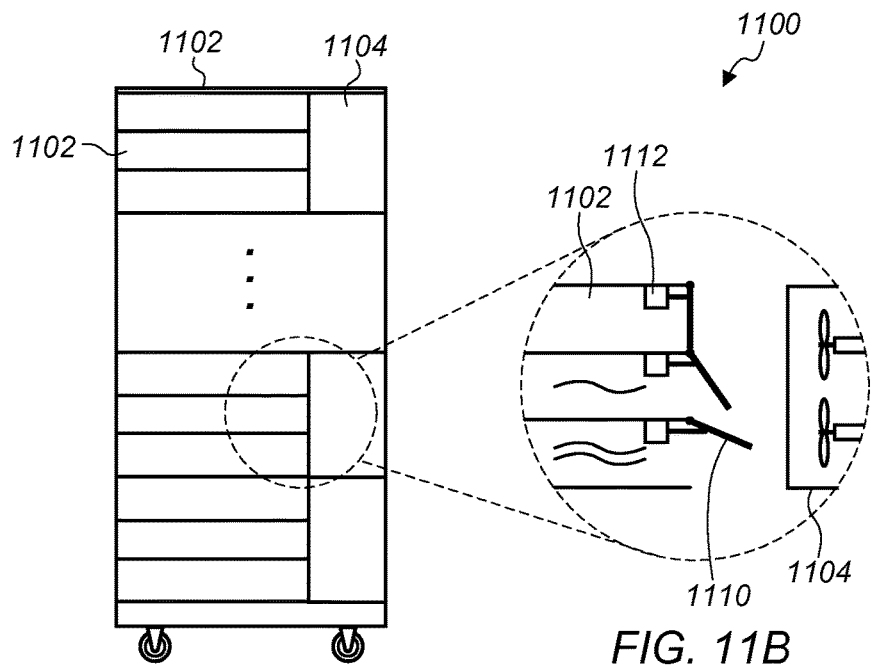
FIG. 11A
FIG. 11B
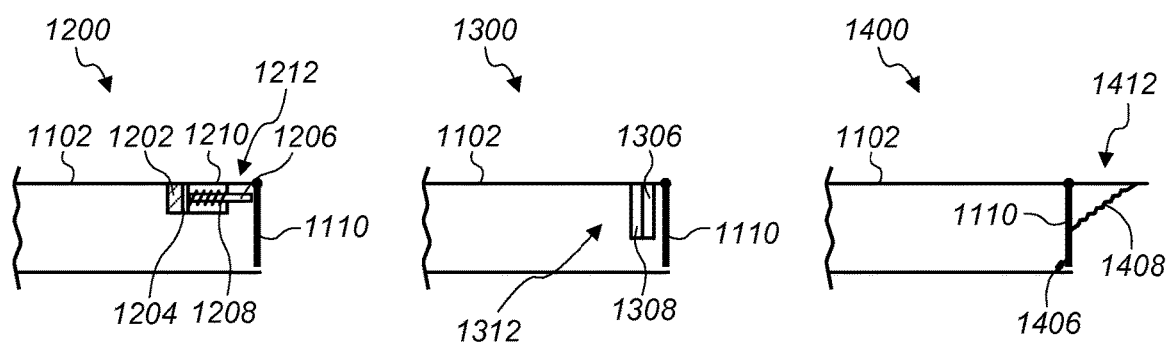
FIG. 12A    FIG. 13A    FIG. 14A
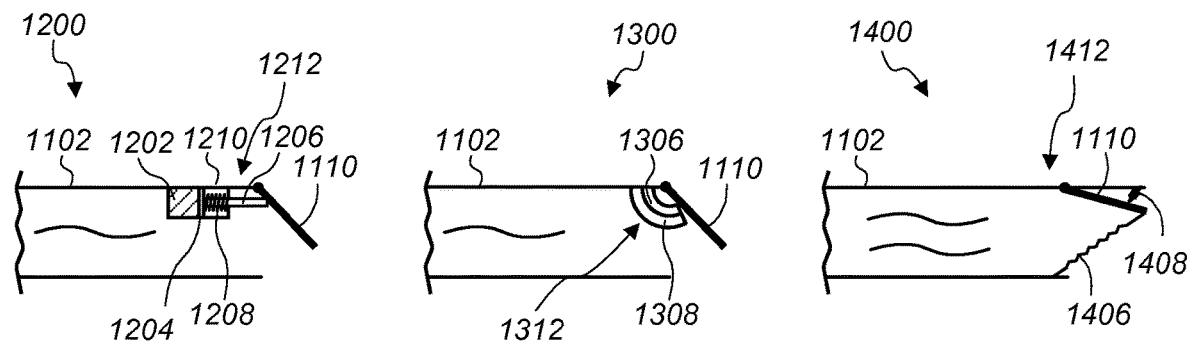
FIG. 12B    FIG. 13B    FIG. 14B

RACK MOUNTABLE THERMAL REGULATION SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computing systems typically include a number of components that generate waste heat. Such components include printed circuit boards, mass storage devices, power supplies, and processors. For example, some computers with multiple processors may generate 250 watts of waste heat. Some known computing systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Computing systems mounted in a rack may include one or more fans mounted in individual computing systems to cool components of the computing systems. Such arrangements may lead to inefficiencies because the computing systems include a large number of relatively small fans that are inefficient when compared to larger fans. Also, the large number of fans mounted in individual computing systems may operate such that some of the fans produce airflows that impede airflows from others of the fans.

Some racks may include rack level fans used to cool computer systems mounted in a rack. However, rack level fans may also lead to inefficiencies in cooling computing systems mounted in a rack. For example, rack level fans may be controlled at a rack level such that all computer systems mounted in the rack receive a similar amount of air flow. In such an arrangement, the rack level fans may be controlled based on a highest measured temperature from a computer system mounted in a rack and therefore provide surplus cooling to other computer systems in the rack that are operating at lower temperatures or the rack level fans may control based on some other configuration and not provide adequate cooling to computer systems that are operating at temperatures greater than other computer system mounted in the rack. Furthermore, air passages in a rack, such as wire access openings, mounting holes, etc., may provide leak paths for air flows generated by rack level fans such that a portion of the air flows generated by rack level fans is lost to air leaks and is not used to cool computer systems mounted in the rack.

BRIEF DESCRIPTION OF DRAWINGS

FIG. 8A illustrates a front view of a cooling canister that includes a server containment section, according to some embodiments.

FIG. 8B illustrates a side view of a cooling canister that includes a server containment section, according to some embodiments.

FIG. 11A illustrates a rack comprising a plurality of slots and a plurality of fans, according to some embodiments.

FIG. 11B illustrates a cutaway view of a portion of the rack comprising a plurality of thermal regulation systems, according to some embodiments.

FIG. 12A illustrates an embodiment of a thermal regulation system within a slot, according to some embodiments.

FIG. 12B illustrates an embodiment of a thermal regulation system within a slot, according to some embodiments.

FIG. 13A illustrates an embodiment of a thermal regulation system within a slot, according to some embodiments.

FIG. 13B illustrates an embodiment of a thermal regulation system within a slot, according to some embodiments.

FIG. 14A illustrates an embodiment of a thermal regulation system within a slot, according to some embodiments.

FIG. 14B illustrates an embodiment of a thermal regulation system within a slot, according to some embodiments.

Figures 1A, 1B:
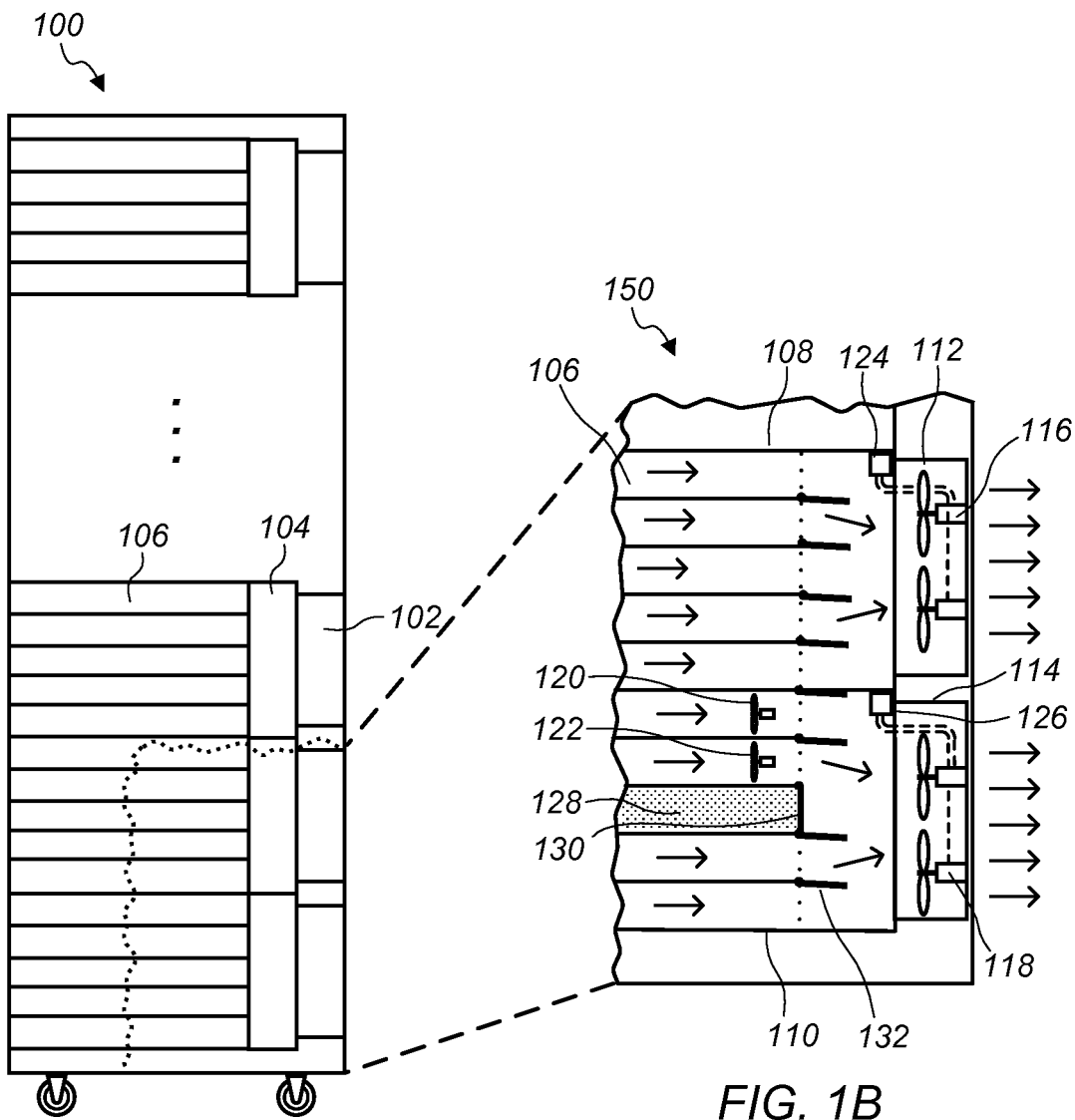
FIG. 1A illustrates a rack comprising a plurality of servers and a plurality of cooling canisters, according to some embodiments.
FIG. 1B illustrates a cut-away view of a portion of a rack comprising a plurality of servers and a plurality of cooling canisters, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

Various embodiments of cooling canisters, and systems and methods for utilizing cooling canisters, are disclosed. According to one embodiment, a computing system comprises a rack, multiple servers coupled to the rack, a plurality of cooling canisters mounted in the rack, and a plurality of fans. The plurality of cooling canisters are mounted in a space in the rack adjacent to the plurality of servers. For example, the cooling canisters may be mounted in a space between an air exhaust of the plurality of servers and a back side of the rack. Individual ones of the cooling canisters include a canister body configured to couple with a subset of the plurality of servers such that air flowing through the subset of servers flows through the canister body. Individual ones of the cooling canisters also include a sealing surface configured to seal the canister body with the subset of servers. For example, the sealing surface of a cooling canister may include a gasket material that forms a seal with a subset of servers mounted in a rack. Also, individual ones of the cooling canisters couple with one or more fans of the plurality of fans. The plurality of cooling canisters mounted in the rack at least include a particular cooling canister coupled with a particular subset of the plurality of servers and another cooling canister coupled with another subset of the plurality of servers such that the particular cooling canister and the other cooling canister are configured to facilitate air flow isolation between an air flow through the particular subset of servers and another air flow through the other subset of servers. For example, one or more fans coupled with the particular cooling canister may generate an air flow that has a different flow rate than an air flow generated by one or more other fans coupled with the other cooling canister, and the particular cooling canister and the other cooling canister may facilitate air flow isolation between the two air flows with different flow rates.

According to one embodiment, a cooling canister includes a canister body configured to couple with a subset of a plurality of servers mounted in a rack such that air flowing through the subset of servers flows through the canister body. The cooling canister also includes a sealing surface configured to seal the canister body with the subset of servers. The cooling canister is configured to mount in a space in the rack adjacent to the subset of servers and is configured to facilitate an air flow isolation between an air flow through the subset of servers coupled to the cooling canister and one or more other air flows in the rack.

According to one embodiment, a method includes coupling a canister to a subset of a plurality of servers mounted in a rack, wherein the canister is coupled in a space adjacent to the subset of servers. The method includes sealing a sealing surface of the canister with the subset of servers and coupling one or more air moving devices to the canister such that the one or more air moving devices are configured to flow air through the subset of servers and through the canister such that an air flow through the subset of servers is substantially isolated from one or more other air flows through other servers mounted in the rack.

According to some embodiments, a server rack comprises a plurality of slots with computing devices mounted in individual ones of the slots. The server rack also comprises a plurality of slot-level thermal regulation systems. At least one of the slot-level thermal regulation systems comprises a louver corresponding to a particular slot and is located between a particular computing device mounted within the particular slot and at least one fan configured to facilitate airflow through the server rack. The louver is configured to regulate airflow through the particular computing device. For example, a louver may adjust its position to increase an area of an air passage to increase an airflow to a particular computing device or adjust its position to decrease an air passage to decrease an airflow to a particular computing device. The at least one slot-level thermal regulation system further comprises a thermally activated unit located in an exhaust flow of the particular computing device and configured to change the angle of the louver in response to a change in thermal energy of the exhaust flow. For example, a thermally activated unit may change an angle of a louver to increase or decrease an area of an air passage to increase or decrease airflow to a particular computing device in response to an increase or decrease in thermal energy in the exhaust flow from the particular computing device.

According to one embodiment, a slot-level thermal regulation system configured to mount within a server rack comprises one or more louvers configured to regulate airflow through a computing device mounted within a slot within the server rack. The slot-level thermal regulation system further comprises an actuator configured to regulate the temperature of the computing device within the slot at least in part by altering the angle of at least one louver of the one or more louvers configured to regulate airflow through the computing device.

According to one embodiment, a method of regulating airflow through a computing device within a server rack is disclosed. The method comprises angling, based at least in-part on a thermal output of the computing device, one or more louvers configured to regulate airflow through the computing device. The one or more louvers are located between the computing device and at least one fan. The method further comprises adjusting the angle of one or more louvers so as to effect a change in airflow through the computing device in response to a change in the thermal output of the computing device and repeating said adjusting in response to each additional change in the thermal output of the computing device.

As used herein, "air moving device" includes any device, element, system, or combination thereof that can move air. Examples of air moving devices include fans, blowers, and compressed air systems.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" or "computing system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, a "rack" means a rack, container, frame, or other element or combination of elements that can contain or physically support one or more computer systems.

As used herein, a "space" means a space, area or volume.

As used herein, a "slot" means a space in a rack configured to accept a device that is to be installed in the rack. Examples of a slot in a rack include a shelf in a rack on which computing devices can be mounted or a pair of rails in a rack on which computing devices can be mounted.

In some embodiments, various components are mounted in a rack such as separate computer systems, devices, etc. Such separate computer systems, devices, etc. may include heat-producing components cooled via airflows through a rack. Such separate computer systems and devices can include one or more data storage modules, data control modules, etc. In some embodiments, each of the data storage modules and data control modules in a rack include one or more heat producing components. Such separate computer systems and devices may include data processing modules, network devices, etc. In some embodiments, each of the processing modules or network devices may include heat producing components, such as processors, switches, etc.

In some embodiments, one or more air moving devices may direct an airflow through one or more of the computer systems or devices mounted in a rack to remove heat from heat producing components of the computer systems or devices mounted in the rack. Air moving devices mounted in individual computer systems or individual devices in a rack may be less efficient at cooling the individual computer systems or individual devices than larger shared air moving devices used to cool multiple computer systems or multiple devices. For example, shared air moving devices may include larger fans and motors that cause an equivalent amount of airflow as multiple smaller air moving devices while consuming less energy than the multiple smaller air moving devices.

Computer systems and devices mounted in a rack may generate varying amounts of waste heat. For example, a particular computer system mounted in a rack may experience a high processing load that causes the computer system to generate a large amount of waste heat while another computer system mounted in the same rack may be experiencing a minimal processing load. The amount of waste heat generated by the other computer system may be considerably less than the amount of waste heat generated by the particular computer system. Shared rack-level air moving devices that supply a shared airflow to the particular computer system and the other computer system may be controlled such that the amount of airflow generated by the shared rack-level air moving devices is sufficient to cool the particular computer system experiencing the high processing load. However, the shared rack-level air moving devices may supply more airflow than is necessary to cool the other computer system experiencing the minimal processing load. The surplus airflow supplied to the other computer system experiencing the minimal load may lead to wasted energy because energy is consumed by the shared rack-level air moving devices to generate the surplus airflow even though the surplus airflow is not necessary to cool the other computer system. Greater efficiencies may be realized by at least partially isolating subsets of computer systems from other subsets of computer systems mounted in a rack such that separate subsets of computer systems are cooled by separate shared air moving devices. Also, air plenums through which airflows used to cool computer systems mounted in racks may include leak paths such as holes for mounting brackets, holes where wires enter or leave a rack, or other types of leak paths. Air flowing out of air plenums via leak paths may also lead to wasted energy.

FIG. 1A illustrates a rack comprising a plurality of servers and a plurality of cooling canisters, according to some embodiments. A cooling canister may mount in a space in a rack adjacent to a subset of servers to facilitate air flow isolation between subsets of servers and to reduce leak paths for air flowing through the subsets of servers. A cooling canister may include a canister body that couples with a subset of servers of a plurality of servers mounted in a rack and a sealing surface that seals the canister body with the subset of servers such that the cooling canister facilitates an air flow isolation for air flow flowing through the subset of servers mounted in the rack. In some embodiments, multiple cooling canisters may be mounted in a rack to facilitate airflow isolation through multiple respective subsets of servers mounted in the rack. A cooling canister coupled to a subset of servers in a rack may form an airtight plenum between the subset of servers coupled a canister body of the cooling canister at one end of the canister body and one or more air moving devices coupled to the canister body of the cooling canister at another end. A sealing surface of a cooling canister may seal against a subset of servers to form the airtight plenum. Note that while the plenum is described to be airtight, some leakage may occur and airtight should be interpreted as airtight within manufacturing tolerances of a sealing surface, such as a gasket.

In some embodiments, a cooling canister mounted in a rack may mount in a space adjacent to an air exhaust end of a subset of servers and also couple to one or more fans that draw air through the subset of servers via an air plenum formed by the cooling canister. In some embodiments a cooling canister may be coupled to an air inlet end of a subset of servers and form an air plenum between fans that direct air into the subset of servers and the subset of servers.

For example, FIG. 1A illustrates multiple cooling canisters mounted in a space in a rack adjacent to a plurality of servers, such that the multiple cooling canisters facilitate air flow isolation between separate subsets of the plurality of servers mounted in the rack. Server rack 100 in FIG. 1A includes servers 106, cooling canisters 104 mounted in a space in rack 100 adjacent to servers 106, and air moving devices 102 coupled with cooling canisters 104. In some embodiments, a server rack in which cooling canisters are mounted is a standard 19" server rack, for example server rack 100 may be a standard 19" rack. In some embodiments, the servers in the server rack, such as servers 106, may be standard sized servers. In some embodiments, a cooling canister may be mounted in a space in a standard rack with standard sized servers without modifying the servers or the rack. In some embodiments, a cooling canister may be mounted in a non-standard size rack. Air moving devices may couple with a cooling canister to cause air to flow through a subset of servers coupled with a cooling canister. For example, FIG. 1A illustrates air moving devices 102 coupled to cooling canisters 104. In some embodiments, air moving device may be mounted on a cooling canister and in some embodiments air moving devices may be separate from a cooling canister and couple with a cooling canister when the cooling canister is installed in a rack. For example, air moving devices 102 may be mounted to a structure of cooling canisters 104. In some embodiments, air moving devices may be mounted to a door of a rack, such as rack 100, and couple with cooling canisters mounted in a space in the rack, such as cooling canisters 104 mounted in rack 100, when a door of the rack is closed.

A cooling canister may be mounted in a rack comprising computer systems of various sizes. For example, a cooling canister may couple with a subset of servers mounted in a rack that includes half-width servers. A cooling canister mounted in a rack may also couple with a subset of servers that includes servers with heights that are non-standard. For example a cooling canister may couple with servers that have heights of 1.5 U, 1.66 U, 2 U, 2.5 U, 3 U, or other non-standard server heights. In another example, a cooling canister may couple with servers that have widths such that 1, 2, 3, or more servers are arranged in a standard 19" slot. FIG. 1A illustrates subsets of servers that include five vertically arranged servers per cooling canister. However, in some embodiments a subset of servers coupled with a cooling canister may include more or less servers.

A cooling canister may couple with or include shared air moving devices that generate an air flow that cools multiple servers in a subset of servers coupled to the cooling canister. Shared air moving devices may be larger and therefore more efficient than smaller air moving devices included in individual servers. For example, FIG. 1B illustrates a cut-away 150 of a portion of rack 100 that includes two cooling canisters 104 (cooling canisters 108 and 110 in FIG. 1B). Servers 106 are coupled to cooling canisters 108 and 110 and air moving devices 112 and 114 are coupled to cooling canisters 108 and 110. In some embodiments, air moving devices 112 and 114 may be mounted to cooling canisters 108 and 110. Air moving devices 112 and 114 include fans 116 and fans 118. Also, fans 120 and 122 are illustrated in two of servers 106. As can be seen in FIG. 1B, fans 116 and 118 included in air moving devices 112 and 114 are larger than fans 120 and 122 mounted in individual servers 106. The size dimensions of individual servers may prevent larger fans from being installed in individual servers. Also fans 116 are configured to generate a shared air flow that is shared between a subset of servers 106 coupled with cooling canister 108 and fans 118 are configured to generate a shared air flow that is shared between another subset of servers 106 coupled with cooling canister 110.

Air moving devices coupled with a cooling canister that generate an airflow shared by a subset of severs coupled with the cooling canister may provide sufficient air flow and cooling for the subset of servers coupled to the cooling canister such that air flow from air moving devices or fans mounted in individual servers is not needed to cool the individual servers. For example, fans 118 in air moving device 114 may generate sufficient air flow through servers 106 coupled with cooling canister 110 such that fans 120 and 122 are not needed to cool servers 106. In some embodiments, servers, such as servers 106, may not include fans, such as fans 120 and 122, and may rely on air flows generated by air moving devices coupled to a cooling canister to provide cooling to the servers, such as air moving device 114.

In some embodiments, a subset of servers coupled to a cooling canister may not include fans mounted within individual servers. For example servers 106 coupled with cooling canister 108 do not include fans mounted in individual servers. In some embodiments, a hybrid cooling model may be employed where one or more air moving devices coupled with a cooling canister generate an air flow to cool a subset of servers coupled to the cooling canister and fans mounted in individual servers of the subset of servers augment an airflow generated by the one or more air moving devices coupled with the cooling canister. For example, air moving device 114 my generate an airflow to cool a subset of servers 106 coupled to cooling canister 110 and fans 120 and 122 may augment the air flow generated by air moving device 114. An example situation would be when a particular server generates higher than normal amounts of waste heat, such as during a spike in processing load. In this situation, fans mounted in a particular server may augment cooling supplied by an air flow generated by an air moving device coupled with a cooling canister. Another example situation would be high ambient temperatures. In some embodiments, when ambient temperatures are high, fans mounted in individual servers may augment cooling supplied by an air flow generated by an air moving device coupled with a cooling canister.

Also, air moving devices coupled to separate cooling canisters may be independently controlled and separate cooling canisters may facilitate air flow isolation such that air flows through a first subset of servers coupled to a first cooling canister flows at a particular rate and such that air flows through a second subset of servers coupled to a second cooling canister at a second rate that is different than the first rate. For example, air moving device 112 may cause air to flow through a subset of servers 106 coupled to cooling canister 108 at a first rate and air moving device 114 may cause air to flow through a separate subset of servers 106 coupled to cooling canister 110 at a second rate that is different than the first rate at which air flows through the subset of servers 106 coupled to cooling canister 108.

A cooling canister may include a controller such as a fan speed controller. For example, cooling canister 108 includes controller 124 and cooling canister 110 includes controller 126. A controller may receive control signals from another source and relay the control signals to air moving devices.

For example controller 126 may receive a control signal from one of servers 106 and relay the control signal to air moving device 114. In some embodiments, a controller may receive measurements associated with a subset of servers coupled with a cooling canister and generate a control signal to control one or more air moving devices coupled to a cooling canister associated with the controller. For example, controller 126 may receive one or more measurement signals relating to measurements of a subset of servers 106, such as temperature, power consumption, processing load, etc. and determine an output signal to control air moving device 114 based on the measurement signals. In some embodiments, a controller may coordinate output speed signals to one or more air moving devices such that the one or more air moving devices are coordinated with one or more air moving devices mounted in individual servers coupled to a cooling canister associated with the controller. For example, controller 126 may coordinate a speed of air moving device 114 with a speed of fans 120 and 122.

In some embodiments a controller may be included in an air moving device instead of being included in a cooling canister. For example, controller 124 may be included in air moving device 112 instead of being included in cooling canister 108. In some embodiments a controller for an air moving device may be separate from a cooling canister and one or more air moving devices coupled to the cooling canister. For example, a controller for an air moving device may be implemented on a server mounted in a rack, such as one of servers 106. In some embodiments, a controller for an air moving device may be implemented by a remote system such as a central control system that controls multiple air moving devices on multiple racks and may route a control signal to the air moving device via network infrastructure associated with servers 106. For example a central control system may route control signals over a network to one or more servers, such as one or more of servers 106, or a top of rack switch associated with a rack, such as rack 100, and one or more links may communicate the control signal from the one or more servers or the top of rack switch to a particular air moving device that is to be controlled. Control schemes for controlling fans mounted in individual servers and for controlling air moving devices coupled to cooling canisters is discussed in more detail below in regard to FIG. 7. Any of the control schemes described below in regard to FIG. 7 may be employed in an arrangement such as that depicted in FIGS. 1A and 1B.

In some embodiments, cooling canisters may include louvers configured to at least partially isolate an empty slot in a subset of slots in a rack to which a cooling canister is coupled to restrict air flow through the empty slot. For example, slot 128 in rack 100 is an empty slot and louver 130 of cooling canister 110 is closed to at least partially isolate empty slot 128 such that airflow generated by air moving device 114 is isolated from empty slot 128 and redistributed amongst servers 106 coupled with cooling canister 110.

In some embodiments, a cooling canister may include multiple louvers mounted on a canister body of the cooling canister at an end of the canister body that is configured to couple with a subset of servers mounted in a rack. For example, cooling canister 110 includes louvers 132 (open) and louver 130 (closed) mounted on an end of cooling canister 110 that is coupled with servers 106. (Note that louvers 132 and louver 130 may be the same type of louver, louvers 132 are labeled collectively solely for ease of illustration in FIG. 1B). In some embodiments, louvers such as louvers 132 and louver 130 may be mounted on a server rack at an end that is configured to couple with a cooling canister, such as cooling canister 110. As discussed in more detail in FIGS. 3-5, louvers such as louvers 132 may have various sizes and may be actuated by various mechanisms. Any of the louver arrangements described in FIGS. 3-5 may be employed in the cooling canisters described in FIGS. 1A and 1B.

In some embodiments, individual louvers mounted on a canister body may be adjusted by a louver adjustment module comprising a thermally activated unit configured to adjust a position of the individual louver in response to changes in temperature. For example, the position or angle of louvers 132 may be adjusted in response to changes in the temperature of air leaving servers 106. Louvers 132 may be adjusted by louver adjustment modules, such as louver adjustment modules 1112 described below in FIG. 11B.

In some embodiments, cooling canisters may be configured to mount in a rack while servers mounted in the rack are in operation. For example, rack 100 may include a back door. The back door may be opened while servers 106 are in operation and cooling canisters 104 may be positioned in a space in rack 100 adjacent to servers 106 while servers 106 are in operation. After cooling canisters 104 are mounted in rack 100, the back door of rack 100 may be closed.

Figure 2:
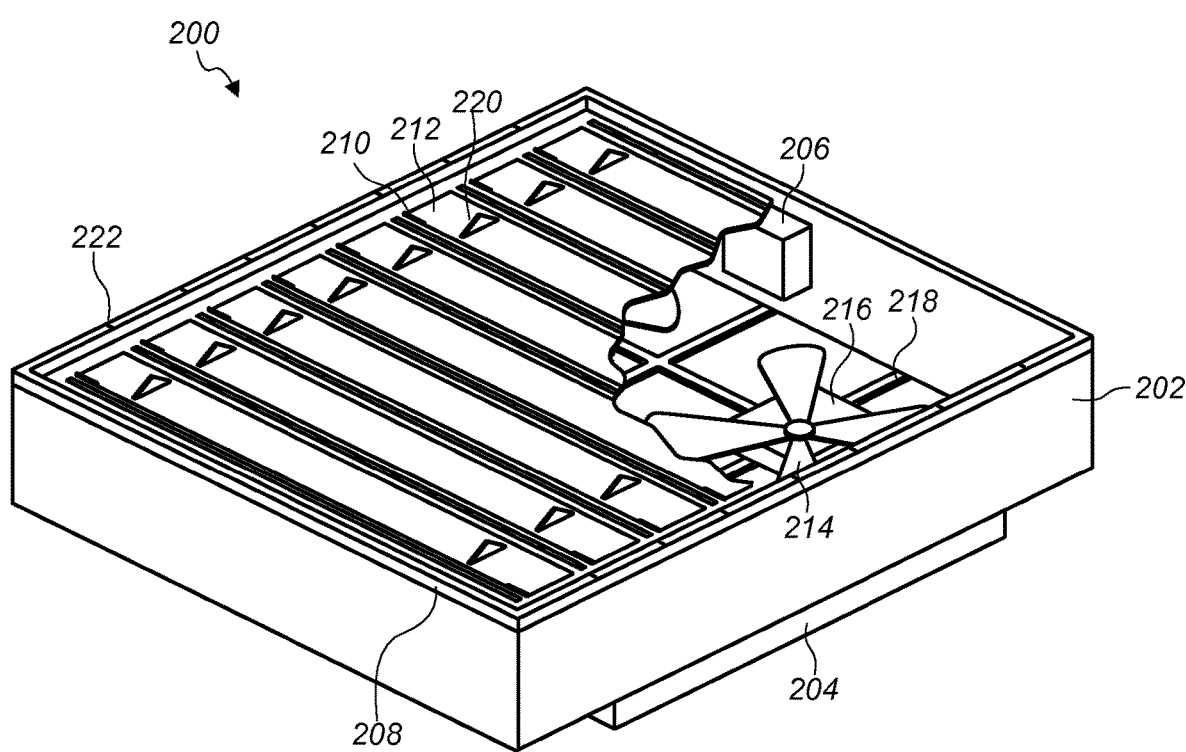
FIG. 2 illustrates a perspective view of a cooling canister, according to some embodiments.

FIG. 2 illustrates a perspective view of a cooling canister, according to some embodiments. Cooling canister 200 illustrated in FIG. 2 may be a cooling canister 104 as illustrated in FIG. 1. Also air moving device 204 may be an air moving device such as air moving device 112 or 114 described in FIG. 1. Cooling canister 200 includes canister body 202 and air moving device 204. In some embodiments, air moving device 204 may be separate from cooling canister 200 and couple with cooling canister 200 when cooling canister 200 is installed in a rack.

In some embodiments, a canister body of a cooling canister, such as canister body 202 of cooling canister 200 may be a contiguous structure configured to couple with a subset of servers mounted in a rack and configured to couple with air moving devices. The contiguous structure of a canister body may form an airtight air plenum between a subset of servers and one or more air moving devices and facilitate an airflow isolation for an airflow generated by the one or more air moving devices. As described above, rack level shared fans may lose efficiency due to various leak paths in a rack housing. However, a cooling canister with a contiguous structure may not include leak paths commonly found in a rack housing because the cooling canister mounts in a space in the rack between a subset of servers and one or more air moving devices coupled to the cooling canister without a need for wires to pass through the cooling canister, mounting brackets to be affixed to the cooling canister, or other such items to be included in the cooling canister that may cause leak paths in a rack housing.

A cooling canister, such as cooling canister 200, may include one or more sealing surfaces. For example cooling canister 200 includes sealing surfaces 208. A sealing surface may be made out of a gasket material such as rubber, foam, or other like gasket materials. In some embodiments, a sealing surface may include cuts between adjacent slots. For example, sealing surface 208 includes cuts 222. Cuts in a sealing surface, such as cuts 222, may allow a gasket material that corresponds with a particular slot to engage with a server installed in the particular slot without deforming a section of gasket material in an adjacent slot that does not include a gasket installed in the adjacent slot. A sealing surface, such as sealing surface 208 may form an air-tight plenum when engaged with one or more servers. Note that a sealing surface may allow some leakage within manufacturing tolerances of a gasket material used in the sealing surface.

Cooling canister 200 also include multiple louvers 212 coupled to canister body 202 via hinges 210. Louvers, such as louvers 212, may include one or more engagement portions configured to engage with a server when a server is installed in a rack slot that corresponds to a particular louver. For example, louvers 212 include triangular engagement portions 220. When a server is installed in a slot corresponding to one of louvers 212, the server will engage triangular engagement portions 220 and displace one of louvers 212 such that the louver 212 rotates about hinge 210 and opens a space corresponding to the particular slot such that air can flow into or out of a server installed in the particular slot. When a server is removed from a slot, a louver corresponding to the slot may close to at least partially isolate the empty slot. In some embodiments, a louver may include one or more holes in the face of the louver that permit some air to flow through the louver when the louver is closed such that the closed louver with holes simulates an impendence to air flow of a server installed in the slot.

In some embodiments, louvers of a cooling canister may include more or less engagement portions than are illustrated in FIG. 2. Also, engagement portions on a louver of a cooling canister may have different shapes, such as a semi-circle shape, an oval shape, a straight prong, or other similar shapes. Louvers of a cooling canister may be made of a plastic material, a metal material, or other lightweight materials.

FIG. 2 shows a cutaway portion of cooling canister 200. As can be seen in the cutaway portion, cooling canister 200 includes controller 206, fan 214, fan motor 216, and fan housing 218. In some embodiments fan housing 218 may be part of canister body 202. In some embodiments, fan housing 218 may be separate from canister body 202 and may be part of a separate air moving device 204 that couples to canister body 202. In some embodiments, fan motor 216 may be a direct current (DC) motor, an alternating current (AC) motor, or an electrically commutated (EC) motor.

Figure 3A:
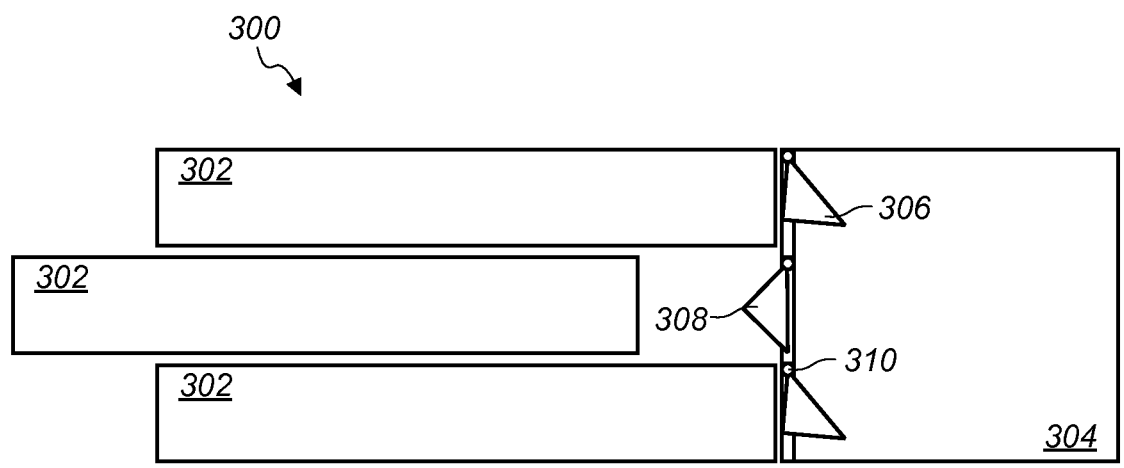
FIG. 3A illustrates louvers of a cooling canister, according to some embodiments.

FIG. 3A illustrates louvers of a cooling canister, according to some embodiments. Computing system 300 includes servers 302, cooling canister 304 and louvers 306, 308, and 310. Each of louvers 306, 308, and 310 include a triangular engagement portion such as engagement portions 220 described in regard to FIG. 2. When a server, such as one of servers 302 is installed in a slot in a rack, an end of the server engages an engagement portion of a louver and causes the louver to rotate about a hinge and open. The opened louver then allows air to flow through the installed server and into a cooling canister, such as cooling canister 304. For example, louvers 306 and 310 are open and allow air to flow between corresponding servers 302 and cooling canister 304. When a slot corresponding to a louver is empty or when a server is removed from a slot corresponding to a louver such that the slot becomes empty, a louver may close such that air flow through the empty slot is substantially restricted. For example, louver 308 is closed and server 302 corresponding to louver 308 is being removed from the slot that corresponds with louver 308. In some embodiments, a louver may include one or more holes that allow some air to flow through the louver when the louver is closed to simulate an impendence to flow of a server. For example, louver 308 may include one or more holes that simulate the impendence to air flow of server 302. Cooling canister 304 and louvers 306, 308, and 310 may be any of the cooling canisters and louvers described in FIGS. 1-10.

Figure 3B:
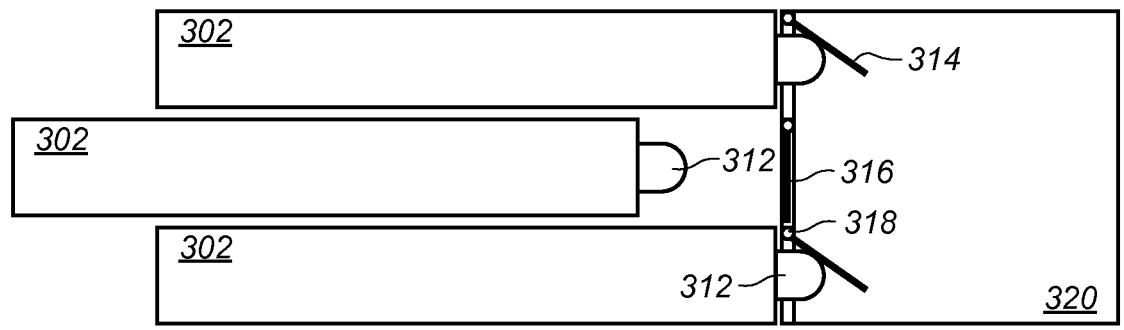
FIG. 3B illustrates louvers of a cooling canister, according to some embodiments.

FIG. 3B illustrates louvers of a cooling canister, according to some embodiments. In some embodiments, engagement portions, such as tab portions 312 may be mounted on a server chassis and extend out from the server chassis such that the tab portions mounted to the server chassis engage with a louver when the server chassis is installed in a slot corresponding to the louver. The tab portions may cause a louver to open when a server is installed in the corresponding slot. For example, tap portions 312 are each mounted to individual ones of servers 302 and engage with corresponding louvers 314, 316, and 318 when servers 302 are installed in a slot that corresponds to the louvers. In FIG. 3B louvers 314 and 318 are engaged with tab portions 312 and are being held open. Louver 316 is not engaged with a tab portion and is closed. Cooling canister 320 and louvers 314, 316, and 318 may be any of the cooling canisters and louvers described in FIGS. 1-10.

Figure 3C:
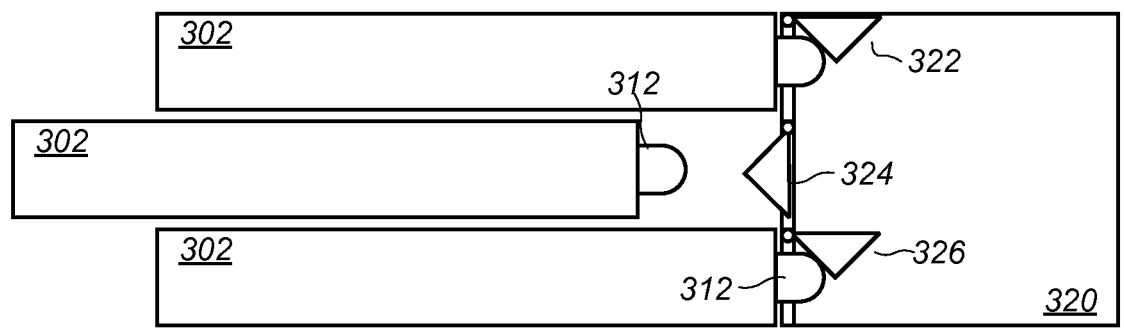
FIG. 3C illustrates louvers of a cooling canister, according to some embodiments.

FIG. 3C illustrates louvers of a cooling canister, according to some embodiments. In some embodiments, engagement portions mounted on a server, such as tab portions 312, may be used in combination with louvers that include engagement portions. For example, FIG. 3C illustrates servers 302 with tap portions 312 mounted on the servers 302 and louvers 322, 324, and 326 that include triangular engagement portions. The triangular engagement portions of louvers 322 and 326 interact with tap portions 312 mounted on servers 302 to cause louvers 322 and 326 to open.

In some embodiments, tab portions configured to mount on a server may have various geometries. FIGS. 3B and 3C illustrate a side view of tab portions. A tab portion may have a thickness that is relatively small compared to the length of the tab portion. For example, a tab portion may have a thickness of about ⅛' inch or less in some embodiments. In some embodiments, multiple thin tab portions may be mounted on a server.

Figure 4:
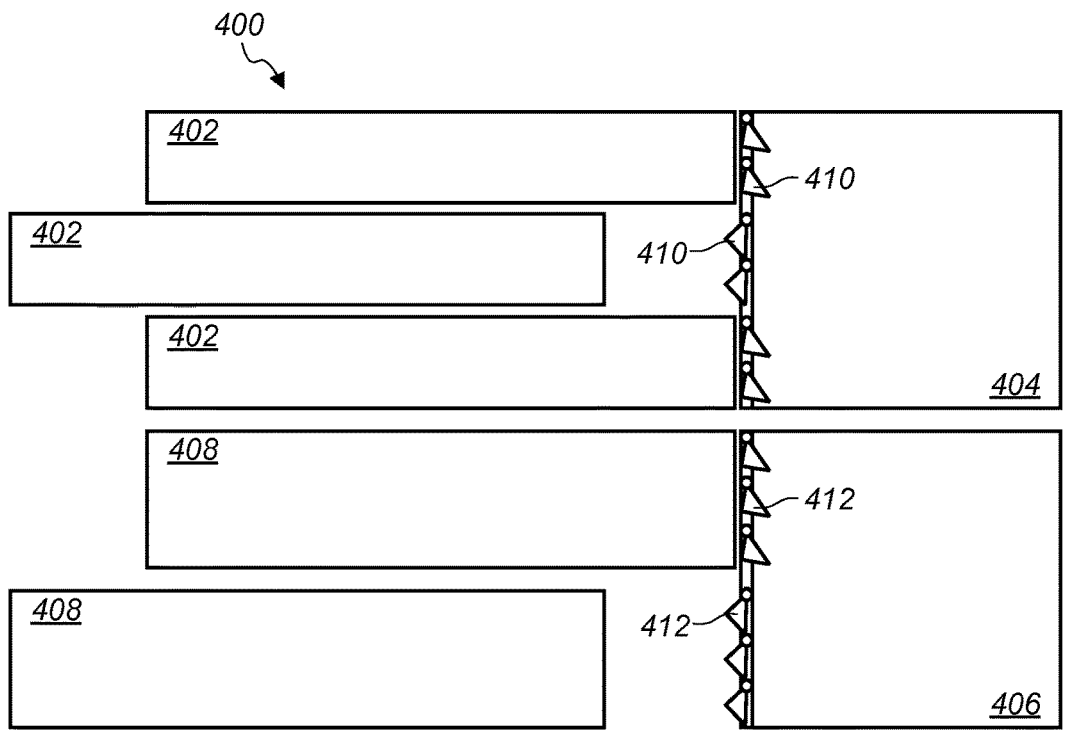
FIG. 4 illustrates a plurality of cooling canisters with louvers, according to some embodiments.

FIG. 4 illustrates a plurality of cooling canisters with louvers, according to some embodiments. System 400 includes cooling canisters 404 and 406. System 400 also includes 1 U servers 402 and 1.5 U servers 408. In some embodiments, louvers may have a vertical height of 0.5 U, such that the 0.5 U louvers engage with servers that have a vertical height that is a whole number multiple of 1 U (i.e. 1 U, 2 U, 3 U, etc.) or can engage with servers that have vertical heights that are non-whole number multiples of 1 U, for example, 1.5 U servers, 2.5 U server, etc. In FIG. 4, servers 402 have a vertical height of 1 U and engage with two 0.5 U louvers, such as louvers 410 mounted in cooling canister 404 when servers 402 are installed in system 400. Servers 408 have a vertical height of 1.5 U and engage with three 0.5 U louvers, such as louvers 412 mounted in cooling canister 406 when servers 408 are installed in system 400. In some embodiments louvers may have other vertical heights. Any of the louvers describe in FIGS. 1-10 may be 1 U louvers, 0.5 U louvers or louvers with some other vertical height as described in FIG. 4.

Figure 5A:
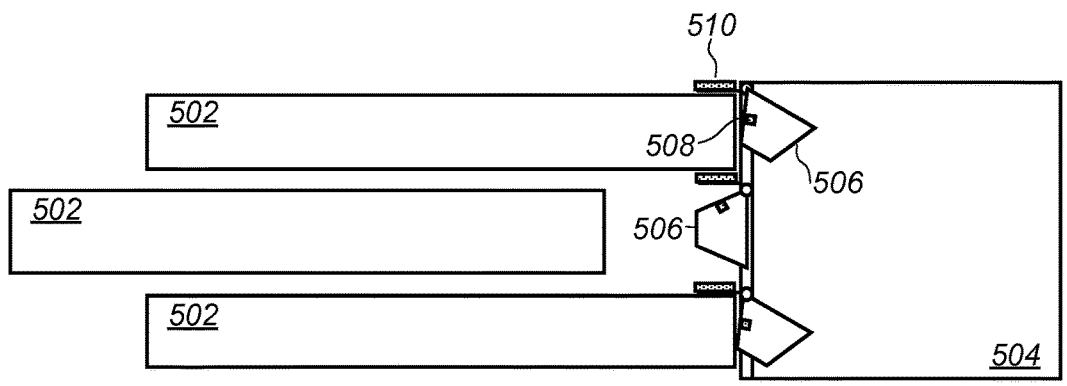
FIG. 5A illustrates a cooling canister that includes magnetic devices and louvers, according to some embodiments.

FIG. 5A illustrates a cooling canister that includes magnetic devices and louvers, according to some embodiments. In some embodiments, magnetic devices may be mounted to a louver, a cooling canister, or both to bias a louver to close when a server is not installed in a slot corresponding to the louver. For example, louver 506 mounted to cooling canister 504 includes magnetic device 508 and cooling canister 504 includes magnetic device 510 mounted to cooling canister 504. When a server, such as server 502 is removed from a slot corresponding to a louver, such as louver 506, a magnetic force between magnetic devices, such as magnetic devices 508 and 510, may cause a corresponding louver, such as louver 506 to close. In some embodiments, one of magnetic devices 508 and 510 may be a ferrous metal and the other may be a magnet. In some embodiments, both magnetic devices 508 and 510 may be magnets. Any of the louvers described in FIGS. 1-10 may include magnetic devices as described in regard to FIG. 5A. FIG. 5A also illustrates louvers with trapezoid shaped engagement portions. In some embodiments magnets may be used with louvers that have engagement portions with different geometries, such triangular engagement portions, trapezoid shaped engagement, or other shaped engagement portions. Any of the louvers described in FIGS. 1-10 may include trapezoid shaped engagement portions as described in regard to FIG. 5A.

Figure 5B:
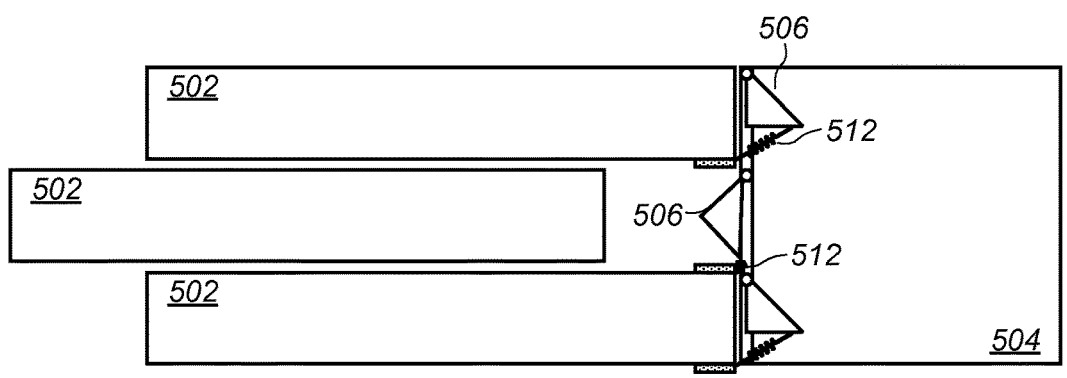
FIG. 5B illustrates a cooling canister that includes spring mechanisms and louvers, according to some embodiments.

FIG. 5B illustrates a cooling canister that includes spring mechanisms and louvers, according to some embodiments. In a similar manner to magnetic devices, spring mechanism may be used to bias a louver to close when a server is not installed in a slot corresponding to the particular louver. In FIG. 5B louvers 506 mounted to cooling canister 504 are coupled to spring mechanisms 512. A spring mechanism, such as spring mechanism 512, may exert a force on a louver causing the louver to close when a slot corresponding to the louver is empty. Any of the louvers describe in FIGS. 1-10 may include spring mechanisms as described in regard to FIG. 5B.

Figure 6A:
FIG. 6A illustrates a cooling canister that includes exhaust louvers, according to some embodiments.
Figure 6B:
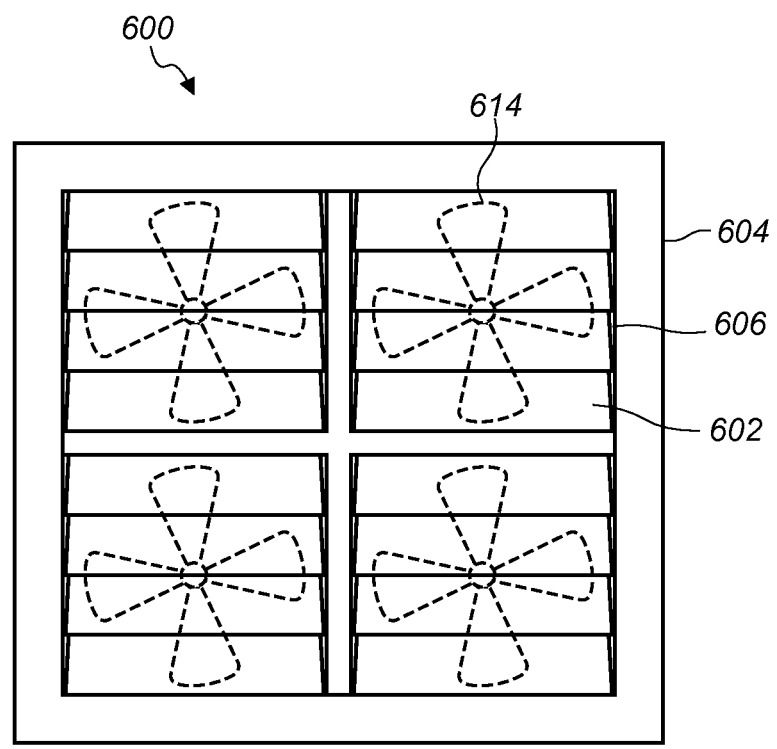
FIG. 6B illustrates an end view of an exhaust end of a cooling canister that includes exhaust louvers, according to some embodiments.

FIG. 6A illustrates a cooling canister that includes exhaust louvers and FIG. 6B illustrates an end view of the exhaust louvers, according to some embodiments. System 600 includes cooling canister 604 and air moving device 606. Air moving device 606 includes exhaust louvers 602. In some embodiments, air moving device 606 may be mounted to cooling canister 604. In FIG. 6B, an end-view of system 600 illustrates an example arrangement of fans 608 in air moving device 606. In some embodiments, individual components of an air moving device, such as fans 608, may be hot-pluggable. A hot-pluggable component, such as fans 608, may be removed while other ones of the components, such as particular ones of fans 608, remain in operation. For example, one of fans 608 may be removed from air moving device 606 mounted to cooling canister 604 while remaining ones of fans 608 remain in operation and provide cooling to a subset of servers coupled to cooling canister 604. Exhaust louvers, such as exhaust louvers 602, may prevent re-circulation and cooling bypass when a fan is not in operation or is removed. For example, when a fan is not in operation a portion of air generated by a remaining fan may be drawn into the suction of the fan and thus create a recirculation loop that bypasses the intended path for air generated by the fan, such as cooling a subset of servers coupled to a cooling canister. An exhaust louver may be a light weight material that is held open by air pressure generated from fans that are in operation and that falls closed when a fan is not generating an airflow. By falling closed, when air is not flowing from a particular fan, an exhaust louver may isolate a flow path through the openings associated with the fan that is not generating airflow and therefore prevent recirculation and cooling bypass.

In some embodiments, fans, such as fans 608 of air moving device 606, may be mounted at an angle or tilted. Installing fans in a tilted arrangement may improve fan efficiently because an exhaust side of a tilted fan may experience less resistance to flow than a perpendicularly mounted fan. For example, in some embodiments, racks may be organized in a data center in aisles, such that a back side of one row of racks face a backside of another row of racks in an adjacent aisle. Heated exhaust air from a rack may be directed into a hot aisle between rows of racks. The heated exhaust air in a hot aisle may be drawn into a cooling system from vents above or below the hot aisle. Fans tilted at an angle may direct exhaust air up towards a vent in a hot aisle or down towards a vent below a hot aisle such that the exhausted air is pulled into the vent. By directing the exhaust air in a direction of a hot aisle vent an airflow from a fan may experience less impedance from airflows from other servers exhausting air into the hot aisle.

Also, tilted fans may facilitate service and maintenance of an air moving devices. For example, fans 608 may be mounted at an angle such that a fan in the top row of fans 608 on air moving device 606 can slide out in front of a fan on a lower row of fans 608 on air moving device 606. In some embodiments, exhaust louvers, such as exhaust louvers 602, may be mounted in a hinged structure, such that a hinged structure including sets of exhaust louvers associated with a particular fan may swing out from the fan so that the fan can be removed. After the fan is removed, the hinged structure that includes the exhaust louvers may be swung back into place to prevent recirculation while the particular fan is removed from the air moving device.

FIG. 6B illustrates an air moving device that includes four fans. In some embodiments, an air moving device may include other quantities and arrangements of fans. For example, in some embodiments, an air moving device may include a single large fan, or other fan arrangements, such as arrangements of three fans, five fans, six fans, etc.

In some embodiments, an air moving device, such as air moving device 606 may provide "N+1" redundancy. Embodiments that provide N+1 redundancy may be sized such that an air moving device includes an additional fan beyond what is required to cool a subset of servers attached to a cooling canister so that if any one of the fans of an air moving device is not operable, the additional fan may provide the lost capacity of the non-operable fan. For example, three fans may be required to provide sufficient cooling for a subset of servers coupled to a cooling canister. However, an air moving device coupled to the cooling canister may include four fans (N+1) so that if any of the three fans were to become inoperable, the fourth fan could provide the lost capacity of the inoperable fan without significant interruption in the cooling provided by the air moving device. Air moving devices have been described as including fans but in some embodiments an air moving device may include other devices that move air such as blowers, compress air sources, etc.

Any of the air moving devices described in FIGS. 1-17 may include exhaust louvers, tilted fans, or N+1 redundancy as described in regard to FIGS. 6A and 6B.

Figure 7A:
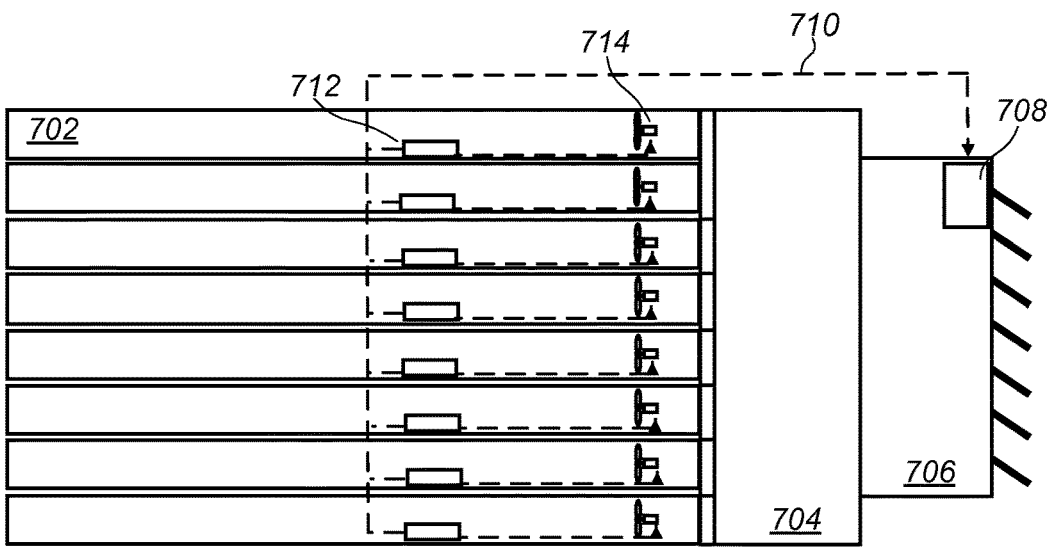
FIG. 7A illustrates control signals in a system that includes a cooling canister, according to some embodiments.
Figure 7B:
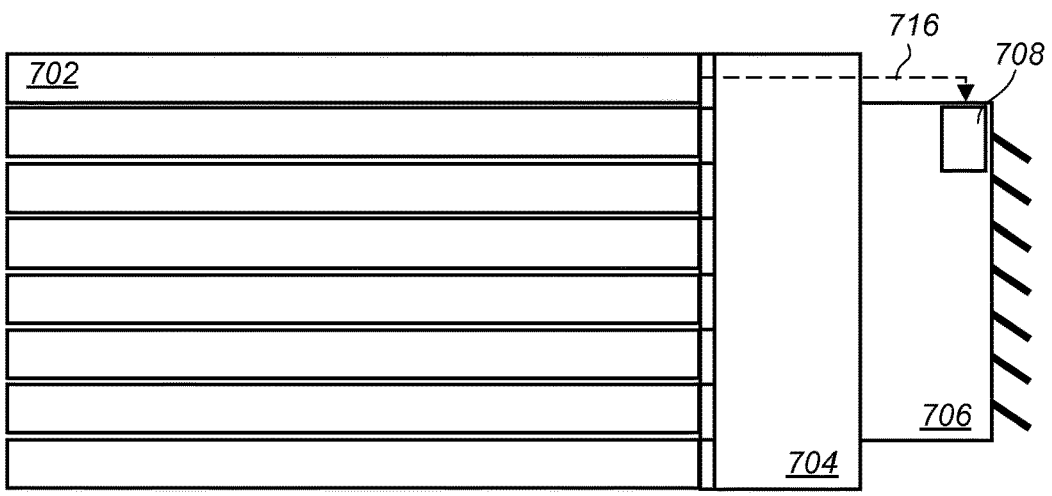
FIG. 7B illustrates control signals in a system that includes a cooling canister, according to some embodiments.
Figure 7C:
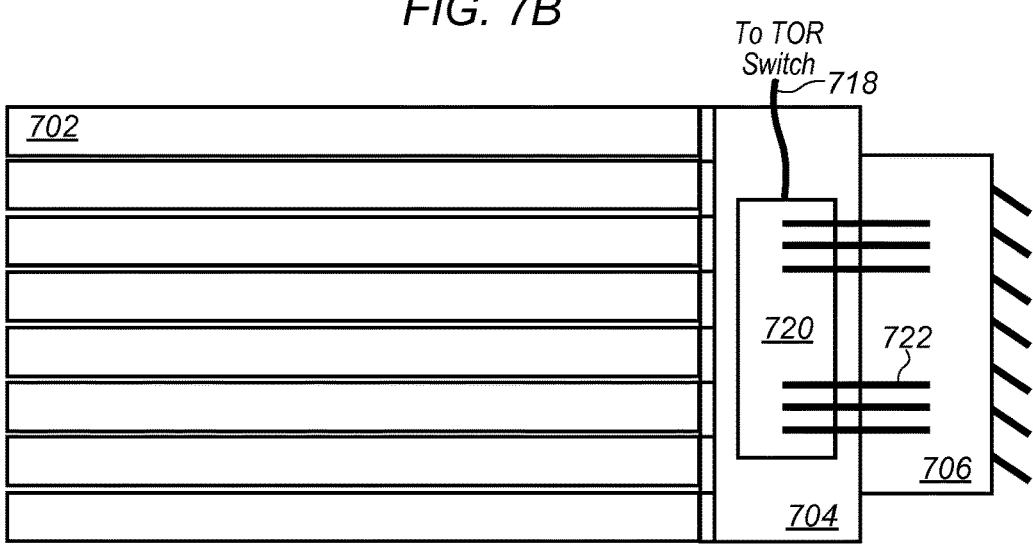
FIG. 7C illustrates control signals in a system that includes a cooling canister, according to some embodiments.

FIGS. 7A-C illustrate control signals in a system that includes a cooling canister, according to some embodiments. In some embodiments, a controller, such as controller 708, may receive control signals used to control fans mounted within individual servers. For example, fan controllers 712 in servers 702 may generate control signals for fans 714. Control signals from multiple fan controllers in multiple servers, such as fan controllers 712 in servers 702, may be communicated to a controller in an air moving device or in a cooling canister such as controller 708 in air moving device 706. A controller, such as controller 708, may determine an output signal to control one or more fans included in an air moving device based at least in part on the received control signals from the multiple fan controllers in the individual servers associated with the air moving device, such as control signals 710 from fan controllers 712. In some embodiments, a controller may select a fan control signal calling for the highest output to be used to control fans of an air moving device. For example, a particular one of fan controllers 712 may be sending an output signal to a particular one of fans 714 to operate at 100% of the fan's capacity, while others of fan controllers 712 may be sending output signals that are less than 100%. A controller, such as controller 708, may select to control fans associated with an air moving device, such as air moving device 706, at 100% output based on the peak output received from the individual fan controllers. In some embodiments, a controller, such as controller 708, may average the control signals received from fan controllers in individual servers and control fans associated with an air moving device based on an average fan control output signal. In some embodiments, other control algorithms may be used.

In some embodiments, a controller, such as controller 708, may receive measurements relating to conditions in servers 702 and determine an output for controlling fans associated with an air moving device based on the received measurements. In some embodiments the received measurements, may include processor temperature, air temperature, air pressure, power consumption, or other measurements indicative of an amount of waste heat needing to be removed from servers, such as servers 702.

In some embodiments, control logic for an air moving device may be implemented in software executed by one or more of server 702. For example, FIG. 7B illustrates server 702 determining an output signal for controlling air moving device 706 and sending output signal 716 to controller 708 of air moving device. Controller 708 may in turn control air moving device 706 in accordance with the control signal for air moving device 706 received from the one or servers 702 that implements the control logic for air moving device 706.

In some embodiments, control decisions for controlling an air moving device may be made by a central controller that controls multiple air moving devices. For example, FIG. 7C illustrates a control signal being received from a top of rack switch via connection 718. A controller, such as controller 720, may be mounted in a cooling canister such as cooling canister 704, or may be mounted in an air moving device such as air moving device 706. Any of the controllers 708 described in regards to FIGS. 7A and 7B may be mounted in a cooling canister, such as cooling canister 704. A controller that receives a control signal from a central controller, may control one or more fans in an air moving device in accordance with the received control signal. For example, controller 720 may send control signals 722 to fans mounted in air moving device 706 in accordance with a control signal received via connection 718 to a top of rack switch. In some embodiments, a central controller may communicate with one or more servers 702 and the one or more servers 702 may communicate control signals to a controller 720 without a connection 718 to a top of rack switch.

FIG. 8A illustrates a front view of a cooling canister that includes a server containment section and FIG. 8B illustrates a side view of the cooling canister that includes a server containment section, according to some embodiments. In some embodiments, a cooling canister may include a server containment section, such as server containment section 802. A server containment section may be integral to a cooling canister such as cooling canister 804, or may be a separate piece that couples with a cooling canister such as cooling canister 804. A server containment section may include shelves, such as shelves 808, for accepting one or more computing devices in a slot of a server containment section. In some embodiments, a server containment section may include rails for mounting computing devices in a server containment section. A server containment section may enclose a subset of servers to reduce leak paths for air flowing through the subset of servers to cool the subset of servers. In some embodiments, a server containment section may mount into a standard 19" rack or may mount into a non-standard rack. For example, server containment section 802 includes mounting brackets 810 for mounting into a standard 19' rack. In some embodiments a server containment section, such as server containment section 802, a cooling canister, such as cooling canister 804, and an air moving device, such as air moving device 806 may be part of a single structure or may be separate components coupled together.

Figure 9:
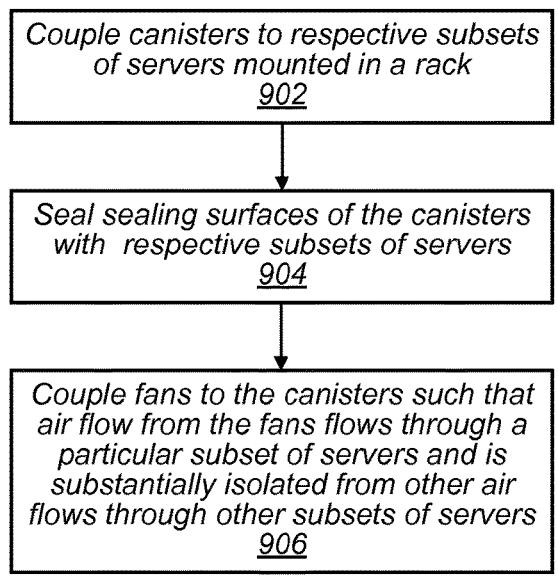
FIG. 9 illustrates a method of installing a cooling canister in a rack, according to some embodiments.

FIG. 9 illustrates a method of installing a cooling canister in a rack, according to some embodiments. At 902 one or more canisters are coupled to respective subsets of servers that are mounted in a rack. The cooling canister may be mounted in a space adjacent to the respective subset of servers and may be mounted upstream of an airflow through the respective subset of servers or mounted downstream of an airflow through the respective subset of servers.

At 904, a sealing surface of a particular canister is sealed against a subset of servers associated with a particular canister. The sealing surface may be a gasket material mounted on a canister body of the canister. The sealing surface may form an airtight plenum with the subset of servers within manufacturing tolerances of a gasket material used for the sealing surface.

At 906, one or more fans are coupled to the canister such that air flow from the one or more fans is configured to flow through a particular subset of servers coupled to the canister and such that the airflow through the particular subset of servers is substantially isolated from other air flows through other subsets of servers mounted in the rack. For example, the canister may include one or more openings at a first end where the one or more openings at the first end are coupled with a subset of servers and the cooling canister may include one or more openings at a second end in which one or more fans are coupled. In some embodiments the one or more fans may be mounted to a canister body of the canister. In some embodiments, the one or more fans may couple with a canister body of a cooling canister without being mounted to the canister body. For example, the one or more fans may be mounted in a door of a rack that couples the one or more fans with the cooling canister when the door of the rack is closed. Any of the cooling canisters described in regard to FIGS. 1-10 may be installed in a rack as described in regard to FIG. 9.

Figure 10:
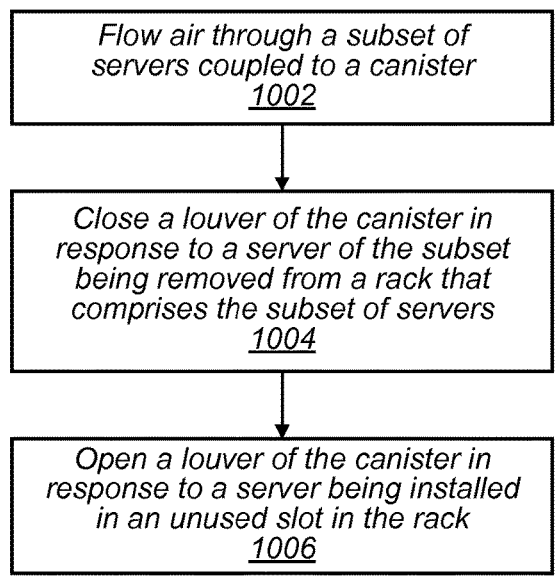
FIG. 10 illustrates a method of restricting air flow through a slot in a subset of rack slots corresponding to a cooling canister, according to some embodiments.

FIG. 10 illustrates a method of restricting air flow through a slot in a subset of rack slots corresponding to a cooling canister, according to some embodiments. Once a cooling canister is installed in a rack, one or more fans coupled to the cooling canister may direct airflow through a subset of servers coupled to the cooling canister. At 1002 air flows through a subset of servers coupled to a canister.

At 1004, in response to a server of the subset of servers coupled to a cooling canister being removed from a slot in a rack, one or more louvers of a cooling canister are closed to isolate airflow away from the empty slot in the rack. Any of the louvers described in FIGS. 1-10 may be used to isolate an empty slot in response to a server being removed from the slot. Air may continue to flow through the remaining servers of the subset of servers while a louver is isolating an empty slot and the remaining subset of servers may remain in operation and be cooled by the flowing air.

At 1006, a louver mounted in a cooling canister coupled to a subset of servers may open in response to a server being installed in a slot that corresponds to the louver. For example, an engagement portion mounted on the louver or mounted on the server may engage with the louver or the server and cause the louver to open. As the louver opens air may flow through the previously empty slot that now contains a server such that an air flow through the server cools the server.

Rack Mountable Thermal Regulation System

As described above, shared air moving devices that supply a shared airflow to multiple computer systems mounted in a rack may result in supplying surplus cooling air to computer system that generate less waste heat than other computer systems receiving the shared airflow or may result in providing insufficient cooling air to computer systems that generate more waste heat than other computer systems receiving the shared airflow. This is because in typical shared air flow arrangements, multiple computer systems receiving the shared air flow receive portions of the shared airflow without regard to varying conditions of individual ones of the multiple computer systems. Also as described above, surplus airflow supplied to computing systems may lead to wasted energy because energy is consumed to generate the surplus airflow even though the surplus airflow is not necessary to cool a particular computer system. Likewise, providing insufficient cooling air to computer systems may negatively affect the performance and/or reliability of the computer systems.

In some embodiments, a louver adjustment module may be used to adjust individual louvers associated with individual computing systems mounted in slots of a rack, such that a shared airflow is distributed to the individual computing systems based on conditions in the individual computing systems. For example, FIGS. 11A-11B illustrate a rack comprising multiple individual computing devices mounted in slots of the rack, where individual slots have corresponding louvers and louver adjustment modules that adjust the individual louvers to regulate airflow through the individual computing systems mounted in the individual slots.

FIG. 11A illustrates a rack 1100, according to some embodiments. The rack 1100 may be a standard 19" rack or may be a non-standard rack. As shown in FIG. 11A, the rack 1100 may comprise one or more slots 1102, and one or more fans 1104. One or more of the slots 1102 may be configured to accommodate placement of at least one computing device, e.g., a server computer, therein. For example, the slots 1102 may comprise one or more rails configured to support a computing device, grooves into which a computing device may slide, other devices, structures and/or mechanisms configured to support a computing device within the slots 1102, or combinations thereof. The rack 1100 may further comprise one or more shelves configured to accommodate placement of at least one computing device thereon. In some cases, the one or more shelves may be located within the slots 1102.

Fans may be located within a rack, for example, fans 1104 may be located within rack 1100. In some embodiments, fans may be located in a door of a rack, e.g., in a door at the rear of rack 1100. The fans 1104 may be configured to facilitate airflow through the slots 1102. Facilitating airflow through the slots 1102 may be considered facilitating airflow through the rack 1100. Facilitating airflow through the slots 1102 may also facilitate airflow through computing devices located therein. As discussed hereinabove, airflow through a computing device may cool the computing device, e.g., by removing waste heat. In some embodiments, the fans 1104 may be similar to the air moving devices 102 described with reference to FIG. 1.

FIG. 11B provides a more detailed view of a portion of the rack 1100. It is understood that features described with respect to the portion of the rack 1100 illustrated in FIG. 11B may also be present in other portions of the rack 1100. FIG. 11B depicts a plurality of slots 1102, a plurality of louvers 1110, a plurality of louver adjustment modules 1112, and fans 1104. As shown in FIG. 11B, fans may facilitate airflow through a plurality of slots, e.g., as fans 1104 may facilitate airflow through slots 1102. In some embodiments, a single fan or multiple fans may facilitate airflow through multiple slots, such as slots 1102. Though FIG. 11B depicts three slots 1102, fans 1104 may facilitate airflow through one or more additional slots 1102, through two slots 1102, or through a single slot 1102. In some cases, air may flow from the back of a rack, e.g., the rack 1100, to the front; however, for the sake of brevity and clarity, FIG. 11B and subsequent figures will be described as though air flows from front to back.

The louvers 1110 may be fixed toward the rear of the slots 1102 between computing devices located within the slots 1102 and the fan 1104. Louvers 1110 may be fixed to physical divisions between slots 1102, e.g., shelves, and/or louvers 1110 may be fixed to other features within the slots 1102. For example, an inter-slot vertical member may be installed on each side of and toward the rear of the rack, and louvers 1110 may be attached thereto. It is understood that, in some embodiments, there may not be physical divisions between different slots 1102; however, divisions are shown herein for the sake of clarity.

Though shown as being fixed to the top of slots 1102, it is contemplated that the louvers 1110 could be inverted and fixed to the bottom of slots 1102. Similarly, the louver adjustment modules 1112 may also be located either at the bottom or at the top of the slots 1102 and may even be located between the top and the bottom of the slots 1102 in embodiments in which louver adjustment modules 1112 are fixed to sidewalls of the rack 1100. In some embodiments, the louver adjustment modules 1112 may be located in exhaust flows of computing devices within slots 1102. The rack 1100 may be manufactured with the louvers 1110 and/or the louver adjustment modules 1112 already in place or the louvers 1110 and/or the louver adjustment modules 1112 may be retrofitted to existing racks.

Each individual louver 1110 may comprise a hinge or other mechanism configured to permit rotational adjustment of the louver 1110. Though primarily rotational embodiments are illustrated herein, it is contemplated that the teachings of the present disclosure may be likewise applied to systems and methods in which the louvers 1110 are adjusted in other ways. For example, a louver 1110 may comprise multiple joints and may be configured to open substantially linearly, e.g., horizontally or vertically, in a manner similar to a garage door. Accordingly, the embodiments discussed in the present disclosure are by way of example only and should not be construed as limiting what is taught herein.

Individual louvers 1110 may be configured to regulate airflow through individual slots 1102. The angle of an individual louver 1110 may determine, at least in-part, how much air flows through an individual slot 1102 to which the individual louver 1110 corresponds. Accordingly, different slots 1102 may receive different airflows. As described in greater detail below, the amount of airflow through a given slot 1102 may be determined, at least in-part, by the temperature of a computing device within the slot 1102. For example, the angle of one or more louvers 1110 may be adjusted so that a desired airflow through the computing device is achieved. A louver 1110 may be biased toward a certain angle such that, absent additional stimulus, the louver 1110 maintains the certain angle. Springs, magnets, the weight of the louver 1110 itself, or combinations thereof may be implemented to bias the louver 1110. In some embodiments, the louver 1110 may be biased toward a position that maximally restricts airflow, e.g., a closed position.

In FIG. 11B, a louver 1110 may maximally restrict airflow when it is in a vertical orientation. For the purposes of this disclosure, a louver 1110 may be referred to as closed when the louver 1110 is in a vertical orientation. Accordingly, adjusting the angle of a louver 1110 to move the angle of the louver 1110 closer to vertical may be referred to as closing the angle of the louver 1110. By contrast, a louver 1110 may provide a maximal amount of airflow when it is in a horizontal orientation parallel with the upper and lower boundaries of the slot 1102 to which it corresponds. For the purposes of this disclosure, a louver 1110 may be referred to as open when the louver 1110 is in a horizontal orientation. Accordingly, adjusting the angle of a louver 1110 to move the angle of the louver 1110 closer to horizontal may be referred to as opening the angle of the louver 1110.

In some embodiments, one or more louvers 1110 may comprise one or more perforations. The perforations may allow at least some airflow even when the louver 1110 is in a closed position, which maximally restricts airflow. The perforations may be configured to allow an amount of airflow sufficient to simulate an airflow impedance of an installed computing device. Simulating an airflow impedance of an installed computing device may maintain a pressure differential sufficient to prevent the fan 1104 from stalling.

FIG. 11B shows single louvers 1110 as corresponding to individual slots 1102; however, embodiments are contemplated in which two or more louvers 1110 may correspond to individual slots 1102. For example, in an embodiment in which an individual slot 1102 has a height of 1 U, two louvers 1110 may correspond to the individual slot 1102 when the two louvers 1110 are arranged one on top of the other and each louver 1110 has a height of ½U. Positioning multiple louvers per 1 U of rack height may allow placement of computing devices of varying sizes within the rack 1100 while maintaining louver 1110 dedication to individual computing devices. Thus, the teachings of the present disclosure are adaptable to non-standard rack sizes. For example, when the rack 1100 comprises louvers 1110 with heights of ½U, then two louvers 1110 can regulate airflow through a computing device with a height of 1 U while three louvers 1110 regulate airflow through a computing device with a height of 1.5 U. In the example, each louver 1110 remains dedicated to regulating airflow through an individual computing device and may thus contribute to the provision of an airflow individualized through that computing device.

Though the figures depict only a single louver adjustment module 1112 per slot 1102, it is contemplated that multiple louver adjustment modules 1112 may be located in a given slot 1102 in a similar manner to the location of the triangular engagement portions 220 described with reference to FIG. 2. For example, one louver adjustment module 1112 may be positioned at each lateral end of a louver 1110 within a slot 1102. In embodiments in which two or more louvers 1110 correspond to an individual slot 1102, one or more louver adjustment modules 1112 may correspond to each louver 1110. For the sake of clarity, the present disclosure refers primarily to single louver adjustment modules 1112 and their relationship to single louvers 1110 within single slots 1102; however, it should be understood that what is taught with respect to single louver adjustment modules 1112 may be applied to embodiments comprising multiple louver adjustment modules 1112 per slot 1102. In embodiments lacking a physical division between slots 1102, the louver adjustment modules 1112 may be affixed to a wall of the rack 1100, to rails within the slots 1102, and/or to other structures.

The louver adjustment modules 1112 may be configured to adjust the angle of louvers 1110. In some embodiments, the louver adjustment modules 1112 may comprise actuators which adjust louvers 1110. An actuator may comprise a member, element, unit, module, device, or mechanism whose movement results in the adjustment a louver 1110. A louver adjustment module 1112 within a slot 1102 may adjust the angle of the louver 1110 configured to regulate airflow through the slot 1102 in response to changes in temperature or thermal output of a computing device within the slot 1102. Hence, the louver adjustment module 1112 may provide an individualized airflow through the computing device. Other louver adjustment modules 1112 within the rack 1100 may do the same. Thus, the airflow through computing devices within the rack 1100 may be individually tailored or regulated on a slot-by-slot and/or computing device-by-computing device basis.

The temperature of a computing device may include an internal temperature, a temperature of a chassis of the computing device, a temperature of an airspace within the chassis, a temperature of a component, e.g., a processor, of the computing device, a virtual temperature, e.g., a temperature estimated from another metric as discussed below, a temperature of an exhaust of the computing device, a temperature of the ambient air surrounding the computing device, or some other temperature. A temperature may be a measurement of thermal energy. A change in thermal energy of an exhaust flow of the computing device may manifest as a change in temperature of the exhaust flow. As used herein, the term "thermal output" may be used interchangeably with the term "temperature."

Computing devices operating at a higher temperature, which may benefit from increased airflow, may receive more airflow than computing devices operating at a lower temperature. Individually tailoring airflow through computing devices within the rack 1100 may conserve resources. For example, less electricity may be consumed in providing airflow through the rack 1100 since provision of excess airflow, and therefore wasted electricity, may be prevented or reduced. It may be the case that closing one louver 1110 increases airflow through slots 1102 other than the slot 1102 to which the louver 1110 corresponds. This effect may be taken into account when adjusting the louvers 1110. For the sake of clarity, the present disclosure describes regulation of airflow through individual slots 1102 primarily as if it were a closed system even though it may not be a closed system in-fact.

The uppermost slot 1102 in FIG. 11B illustrates a scenario in which a computing device is either absent from the uppermost slot 1102 or is operating within the uppermost slot 1102 at a low thermal output. In some embodiments, a low thermal output may be approximately no thermal output, less than about 5% of maximum thermal output, less than about 10% of maximum thermal output, less than about 20% of maximum thermal output, or some other thermal output. Maximum thermal output may include the maximum operating temperature that the computing device is capable of reaching, a maximum operating temperature that has been predefined, or some other thermal output. The louver 1110 regulating airflow through the uppermost slot 1102 is depicted in a closed position, which restricts airflow.

The middle slot 1102 illustrates a scenario in which a computing device is operating within the middle slot 1102 at a moderate thermal output. In some cases, ordinary operating conditions of a computing device may produce a moderate thermal output. The louver 1110 regulating airflow through the middle slot 1102 is depicted as being partially opened. The louver adjustment module 1112 is depicted as providing a force sufficient to open the angle of the louver 1110.

The lowermost slot 1102 illustrates a scenario in which a computing device is operating within the lowermost slot 1102 at a high thermal output. The louver 1110 regulating airflow through the lowermost slot 1102 is depicted as being opened to a greater extent than the louver 1110 regulating airflow through the middle slot since the computing device located in the lowermost slot 1102 is operating at a higher thermal output than the computing device located in the middle slot 1102. Once more, the louver adjustment module 1112 is depicted as providing force sufficient to open the angle of the louver 1110.

While the louvers 1110 are only shown in three positions in FIG. 11B, it should be understood that the louvers 1110 may be angled at any angle between fully closed and fully opened, e.g., at any angle between vertical and horizontal. It is also contemplated that adjustment through different portions of the louver 1110's range of motion may be handled by different louver adjustment modules 1112. For example, a slot 1102 may comprise two louver adjustment modules 1112—one configured to adjust the louver 1110 from closed to partially open and one configured to adjust the louver 1110 from partially open to fully open. The two louver adjustment modules 1112 may be configured to operate under different temperature ranges and/or may be positioned such that when the stroke length of one has reached its limit, the other one begins.

In some embodiments, a stop may be positioned to prevent the louvers 1110 from opening substantially more than horizontal. In some embodiments, the louvers 1110 may be adjusted in a smooth, continuous adjustment. For example, a louver 1110 may be moved from a closed position to a partially open position gradually as a thermal output of a computing device increases. Furthermore, the louver 1110 may be moved back towards a closed position as thermal output of the computing device decreases. Accordingly, the louver 1110 may be constantly adjusted as thermal output of the computing device changes.

In some cases, the louvers 1110 may be adjusted to a limited number of angles, e.g., closed, partially open, and maximally open. In some embodiments, a louver 1110 may remain at a certain angle until a threshold temperature has been reached at which point the louver 1110 may be immediately adjusted to a different angle. In other words, rather than gradually being moved from a closed position to a partially opened position as the thermal output of a computing device increases, adjustment from closed to partially open may occur rapidly or substantially instantly in response to a first threshold temperature being reached. The louver 1110 may remain in the partially open position until the thermal output of the computing device falls below the first threshold temperature, at which point the louver 1110 may be returned to the closed position, or until the thermal output of the computing device reaches a second threshold temperature and is adjusted a second time. Though three positions and two threshold temperatures have been described, it should be understood that additional or fewer positions and threshold temperatures may be implemented in accordance with the teachings of the present disclosure.

It should be understood that the illustrations of the louver adjustment modules 1112 are schematic in nature. The louver adjustment modules 1112 may take a variety of forms. Though illustrated as being positioned on the computing device side of the louvers 1110, in some embodiments, one or more louver adjustment modules 1112 may be located on the fan side of the louvers 1110 or may comprise elements located on both sides of the louvers 1110.

As will be discussed in greater detail with respect to FIG. 15, in some embodiments, one or more louver adjustment modules 1112 may be adjusted in response to instructions from a system configured to monitor the operating temperature of one or more computing devices. As will be discussed in greater detail with respect to FIGS. 12-14, in some embodiments, one or more louver adjustment modules 1112 may be self-adjusting. That is to say that they may adjust the positions of the louvers 1110 without receiving instructions, e.g., electronically transmitted instructions, from a monitoring system. Self-adjusting louver adjustment modules 1112 may directly respond to a thermal output of a computing device. For example, a self-adjusting louver adjustment module 1112 may change shape or change dimension in response to changes in thermal energy.

The rack 1100 may be manufactured with the louver adjustment modules 1112 installed at the time of manufacture or existing racks may be retrofitted to accept the louver adjustment modules 1112. In some contexts, the combination a louver adjustment module 1112 and a louver 1110 whose angle it is configured to adjust may be considered a thermal regulation system or slot-level thermal regulation system. The thermal regulation system may comprise additional features as well, e.g., features discussed with reference to FIG. 15. In some contexts, the louver adjustment module 1112 may be referred to as a thermally activated unit or as a thermally responsive unit.

In some embodiments, a louver adjustment module may comprise an actuator actuated by a piston driven by a thermally responsive material. A thermally responsive material may change volumes, shape, dimension, etc., in response to temperature changes. The thermally responsive material may exert force on the piston causing the piston to move as the thermally responsive material responds, e.g., increases in volume, to temperature changes. Movement of the piston may result in adjustment of an angle of a louver which may result in a change in airflow through a slot.

For example, FIG. 12A and FIG. 12B illustrate a thermal regulation system 1200 within one of the slots 1102, according to some embodiments. The thermal regulation system 1200 comprises a louver 1110 and a louver adjustment module 1212. The louver adjustment module 1212 may be an embodiment of the louver adjustment module 1112 described hereinabove. The louver adjustment module 1212 comprises a thermally responsive material 1202, a piston 1204, an actuator 1206 coupled to the piston 1204, a spring 1208 configured to bias the piston 1204 to a contracted position, and a housing 1210. In some embodiments, one or more elements may be excluded. For example, the spring 1208 may not be included in an embodiment in which the weight or other bias of the louver 1110 is sufficient to bias the piston 1204 to a contracted position. A computing device may be placed in the slot 1102. FIG. 12A illustrates a situation in which the computing device is either absent or is operating at a low thermal output. By contrast, FIG. 12B illustrates a situation in which the computing device is operating at an increased, e.g., moderate, thermal output which has caused the thermally responsive material 1202 to expand resulting in adjustment of the angle of louver 1110.

The thermally responsive material 1202 may be contained within a chamber defined by the inner walls of the housing 1210 and the piston 1204. The thermally responsive material 1202 may change dimension in response to changes in thermal energy within the slot 1102. For example, a computing device within the slot 1102 may increase its thermal output, which may increase the temperature of an exhaust flow in which the louver adjustment module 1212 sits, and the thermally responsive material 1202 may expand in response to the increase in temperature. Similarly, the thermally responsive material 1202 may contract in response to decreases in temperature. In some embodiments, the thermally responsive material 1202 may be substantially non-compressible.

Changes in dimension, e.g., expansion, of the thermally responsive material 1202 may drive the piston 1204 with sufficient force to bring the actuator 1206 into contact, either direct or indirect, with and adjust the angle of the louver 1110. The louver adjustment module 1212 may be positioned such that the actuator contacts the louver 1110 close to the hinge or rotational mechanism of the louver 1110. As illustrated in FIGS. 12A and 12B, expansion of the thermally responsive material 1202 opens the angle of the louver 1110 and contraction of the thermally responsive material 1202 allows the angle of the louver 1110 to be closed. In some embodiments, expansion of the thermally responsive material 1202 may close the angle of the louver 1110 and contraction of the thermally responsive material 1202 may open the angle of the louver 1110.

The thermally responsive material 1202 may comprise a solid, a liquid, a gas, or combinations thereof. In some embodiments, the thermally responsive material 1202 may change states as it is heated or cooled during operation of a computing device within the slot 1102. In some embodiments, the thermally responsive material 1202 may comprise a wax, e.g., a paraffin wax. The wax may melt, and expand, as thermal energy incident on the wax increases. Expansion of the wax may open the louver 1110 as described above. Materials chosen for inclusion in the thermally responsive material 1202 may be chosen based on their ability to change dimension to a degree sufficient to fully open the louver 1110, or to open the louver 1110 to some other desired angle, in response to thermal outputs of a computing device within the slot 1110. Thus, materials which change dimension at temperatures which would exist under operating conditions may be preferentially selected.

In some embodiments, a capillary thermostat may be used. A capillary thermostat may comprise a bulb containing a material, e.g., thermally responsive material 1202, configured to increase in volume in response to an increase in thermal energy and decrease in volume in response to a decrease in thermal energy. The material may be substantially non-compressible. The bulb may be connected to a capillary in fluid connection with the bulb such that liquids, gasses, and solids may pass between the bulb and the capillary. The capillary thermostat may further comprise a diaphragm, bellows, piston, e.g., a piston 1204, or other module coupled to an actuator, e.g., the actuator 1206. For brevity, only embodiments comprising a diaphragm are discussed, but it is understood that, in some cases, bellows, pistons, etc., may be substituted for the diaphragm.

In some embodiments, the capillary thermostat may be located in an exhaust flow of a computing device within the slot 1102. An increase in temperature or thermal energy of the exhaust flow may cause the material contained in the bulb to increase in volume. In some embodiments, the material may change state from a liquid to a gas. The increase in volume may increase pressure on the diaphragm and may cause the diaphragm to expand. Expansion of the diaphragm may cause the angle of the louver 1110 to be opened. Contraction of the diaphragm in response to a decrease in volume of the material may allow the angle of the louver 110 to be closed. In some embodiments, the diaphragm may be biased to a contracted position in a similar manner as that described hereinabove.

It should be understood that the teachings of FIGS. 12A and 12B may apply to other embodiments in which pressure from expansion of a confined material powers an actuator to alter an angle of one or more louvers. In some embodiments, bellows, a diaphragm, or other structures configured to respond to expansion of the material may be substituted for a piston.

FIGS. 13A and 13B illustrate a thermal regulation system within a slot, according to some embodiments. A thermal regulation system may include a louver and a bimetallic unit configured to alter an angle of the louver in response to changes in thermal energy incident on the bimetallic unit. For example, FIGS. 13A and 13B illustrate a thermal regulation system 1300 within one of the slots 1102. The thermal regulation system 1300 comprises a louver adjustment module 1312 and a louver 1110. The louver adjustment module 1312 may be an embodiment of the louver adjustment module 1112 described hereinabove and may be located in an exhaust flow of a computing device within the slot 1102. The louver adjustment module 1312 comprises a first metal 1306 and a second metal 1308 joined together as a bimetallic unit. The two metals 1306 and 1308 may be joined by rivets, bolts, brackets, combinations thereof, and/ or may be joined in other ways. The first metal 1306 and the second metal 1308 remain distinct from each other. In other words, together they do not form an alloy though either one may itself comprise an alloy.

The first metal 1306 may have a lower coefficient of thermal expansion than the second metal 1308. Thus, the second metal 1308 may expand more rapidly than the first metal 1306 as temperature increases. The bimetallic unit may be configured to bend, deviate laterally, deviate rotationally, or otherwise magnify the effect of thermal expansion of the first metal 1306 and the second metal 1308. In other words, the configuration of the first metal 1306 and the second metal 1308 may amplify positional deviation of the bimetallic unit due to thermal expansion. The bimetallic unit may be positioned within the slot 1102 such that the bimetallic unit bends towards the louver 1110 in response to an increase in thermal energy incident on the bimetallic unit, e.g., an increase in thermal energy or temperature of an exhaust flow in which the bimetallic unit sits. Accordingly, the first metal 1306, with the lower coefficient of thermal expansion, may be located such that it will make up the inner surface of the bend—the shorter distance.

The bimetallic unit may force open the louver 1110 as the bimetallic unit expands. For example, the second metal 1308 may expand to a greater extent than the first metal 1306 thus causing the bimetallic unit to bend and contact, either directly or indirectly, the louver 1110. As the second metal 1308 continues to expand, the force of expansion may be sufficient to alter the angle of the louver 1110. FIG. 13A illustrates a situation in which a computing device is either absent or is operating at a low thermal output within the slot 1102. By contrast, FIG. 13B illustrates a situation in which the computing device is operating at an increased, e.g., moderate, thermal output sufficient to cause the bimetallic unit to expand. As discussed, the extent of expansion of the second metal 1308 relative to the expansion of the first metal 1306 may cause the bimetallic unit to bend and alter the angle of the louver 1110. As the computing device is cooled by the increased airflow allowed by the partially opened louver 1110, the bimetallic unit may cool and contract toward the starting position.

This cooling and heating of the bimetallic unit may be cyclical and ongoing as long as a computing device is operating within the slot 1102. For example, the computing device may increase its processing load and may heat-up and generate more waste energy. The waste energy may be incident on the bimetallic unit causing the bimetallic unit to expand and open the louver 1110. Increased airflow passing through the computing device due to the opening of the louver 1110 may cool the computing device. The bimetallic unit may remain expanded while the computing device is at the increased processing load. When the computing device reduces its processing load and generates less waste energy, the bimetallic unit may contract, which closes the louver 1110. The bimetallic unit may expand again when the computing device once again increases its processing load. The same may be true for other embodiments of the louver adjustment module 1112 as well.

It should be understood that the louver adjustment module 1312 is depicted schematically in FIG. 13. The louver adjustment module 1312 may comprise a bimetallic strip similar to the configuration illustrated in FIG. 13; however, it is contemplated that the louver adjustment module 1312 may take a variety of different forms in some embodiments. For example, the louver adjustment module 1312 may comprise a bimetallic coil, a bimetallic cantilever beam, other bimetallic configurations, or combinations thereof. In some cases, the louver 1110 itself may comprise a bimetallic unit which behaves in a similar manner to the bimetallic units described herein.

In an embodiment in which the louver adjustment module 1312 comprises a bimetallic coil, the bimetallic coil may be positioned on a computing device side of the louver 1110 as illustrated by the location of louver adjustment module 1312 in FIG. 13B. The bimetallic coil may be configured to uncoil, e.g., by locating the second metal 1308 on the inner part of the coil, in response to an increase in thermal energy. The bimetallic coil may be positioned such that uncoiling of the bimetallic coil opens the louver 1110. In another embodiment, the bimetallic coil may be centered about the hinge of the louver 1110 and the coiling or uncoiling of the bimetallic coil in response to changes in thermal energy within the slot 1102 may alter the angle of louver 1110.

FIGS. 14A and 14B illustrate a thermal regulation system within a slot, according to some embodiments. A thermal regulation system may comprise a louver, a memory metal, such as nitinol, configured to open the louver in response to a threshold temperature being reached, and a spring configured to close the louver at temperatures below the threshold temperature. For example, FIGS. 14A and 14B illustrate a thermal regulation system 1400 within one of the slots 1102. The thermal regulation system 1400 comprises a louver adjustment module 1412 and the louver 1110. The louver adjustment module 1412 may be an embodiment of the louver adjustment module 1112 described hereinabove and may be located in an exhaust flow of a computing device within the slot 1102. The louver adjustment module 1412 comprises a spring 1406 and a memory metal 1408. The spring 1406 may be configured to bias the louver 1110 to a closed position.

The memory metal 1408 may comprise an alloy that returns to a pre-deformed shape when heated. In some contexts, the memory metal 1408 may be considered a shape-memory alloy, a smart metal, a memory metal, a memory allow, a smart alloy, etc. The memory metal 1408 may comprise one of the following alloys: Ag—Cd; Au—Cd; Cu—Al—Ni; Cu—Sn; Cu—Zn; Cu—Zn—X; Fe—Pt; Mn—Cu; Fe—Mn—Si; Co—Ni—Al; Co—Ni—Ga; Ni—Fe—Ga; Ti—Nb; Ni—Ti; Ni—Ti—Hf; Ni—Ti—Pd; or Ni—Mn—Ga. Other alloys are also possible. An alloy may be chosen based on the expected operating temperatures of a computing device placed within the slot 1102. For example, it may be determined that the computing device may benefit from being cooled by increased airflow at temperatures above 'X.' An alloy that returns to its pre-deformed shape at temperatures of 'X' or higher may be chosen.

A computing device may be placed in the slot 1102. FIG. 14A illustrates a situation in which the computing device is either absent or is operating at a low thermal output. By contrast, FIG. 14B illustrates a situation in which the computing device is operating at an increased thermal output. As shown in FIG. 14A, the spring 1406 may bias the louver 1110 to a closed position with sufficient force to deform the memory metal 1408. When the thermal output of the computing device reaches a threshold temperature, the memory metal 1408 may snap back to its pre-deformed shape. FIG. 14B illustrates a scenario in which the thermal output of the computing device reached or surpassed a threshold temperature, and the memory metal 1408 snapped back to its pre-deformed shape after being heated to the threshold temperature by the thermal output.

The memory metal 1408 in its pre-deformed shape may hold the louver 1110 in an open position. While heated at a temperature equal to or above a threshold temperature, the memory metal 1408 may resist deformation with sufficient strength to prevent the spring 1406 from closing the angle of the louver 1110. Though the pre-deformed shape of the memory metal 1408 is shown as being that of a spring, it is contemplated that the pre-deformed memory metal 1408 may be U-shaped, form an angle, or take some other shape. The connection points of the spring 1406 and the memory metal 1408 to the louver 1110 may be reversed or otherwise vary in some embodiments. The connections shown in FIG. 14 are illustrative only and are not intended to limit the scope of the present disclosure.

In some embodiments, louver adjustment modules may be electronically controlled. Electronic sensors may monitor the temperature of computing devices within a rack and may relay temperature data to a management system which operates the louver adjustment modules. On a slot-by-slot basis, the management system may determine at which angle a louver regulating airflow through a particular slot should be placed based on a temperature of a computing device within the particular slot. The management system may then direct a louver adjustment module within the particular slot to adjust the angle of the louver accordingly.

Figure 15:
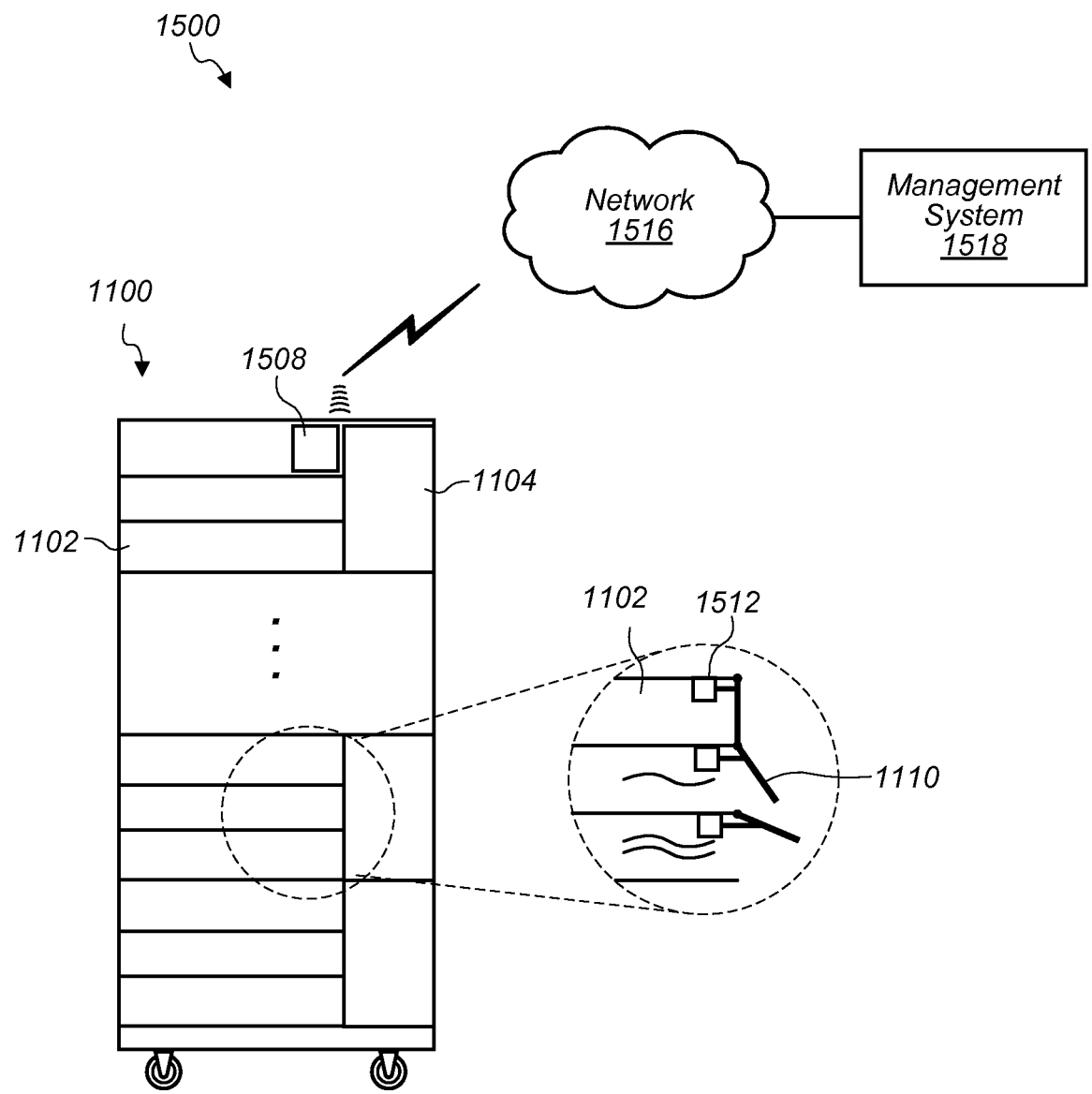
FIG. 15 illustrates a system for slot-by-slot temperature regulation, according to some embodiments.

For example, FIG. 15 illustrates a system 1500, according to some embodiments. The system 1500 comprises the rack 1100, a network 1516, and a management system 1518. The rack 1100 comprises slots 1102, fans 1104, louvers 1110, a control module 1508, and a louver adjustment module 1512. In some embodiments, the system 1500 may be configured to regulate airflow on a slot-by-slot basis based on the temperature of computing devices in respective slots 1102. Sensors may communicate computing device temperature data to the control module 1508 which may communicate the temperature data to the management system 1518 via the network 1516. Though FIG. 15 depicts the control module 1508 as communicating wirelessly, it is contemplated that the control module 1508 may additionally or alternatively communicate via a wired connection.

Sensors may be located within the computing devices or may be external to the computing device, e.g., in an exhaust flow of the computing device. Sensors may collect temperature data from the computing devices. Temperature data obtained from a particular computing device may be used to determine how to angle one or more louvers 1110 which regulate airflow through the slot 1102 in which the computing device is located. The one or more louvers 1110 may be adjusted so as to keep the computing device operating within a desired temperature range. Sensors may measure computing device temperatures or other metrics, e.g., processor usage or workload, power consumption, etc., from which operating temperatures can be estimated. Accordingly, temperature data may comprise information about the actual operating temperature of a computing device, information about the processor usage or workload of a computing device, information about the power consumption of a computing device, other information, or combinations thereof.

The management system 1518 may comprise a remote system which is configured to receive temperature data of computing devices within the rack 1100. The management system 1518 may determine an appropriate angle for each of the louvers 1110 on a slot-by-slot basis. The determination may be based at least in-part on temperature data received from the control module 1508. The management system 1518 may be in communication with louver adjustment modules 1512, which may adjust louvers 1110 according to signals received from the management system 1518. The louver adjustment modules 1512 are illustrated schematically. It should be understood that the louver adjustment modules 1512 may comprise any motor, device, mechanism, etc., configured to adjust the angle of the louvers 1110 in response to signals received from the management system 1518. In some cases, the management system 1518 may oversee a plurality of racks 1100, may receive temperature data concerning computing devices contained therein, and may be in communication with louver adjustment modules contained therein as described above.

In some embodiments, regulation of airflow on a slot-by-slot basis based on the temperature of computing devices in respective slots 1102 may be managed by the control module 1508 rather than the management system 1518. The control module 1508 may be configured to monitor one or more parameters or metrics of the computing device and operate, e.g., via control signals, an actuator of a louver adjustment module 1512 to alter the angle of at least one louver 1110 configured to regulate airflow through the computing device in response to a change in at least one of the one or more parameters or metrics. The control module 1508 may be electrically powered and may comprise at least one processor.

Alternatively, the rack 1100 may lack the control module 1508 and the angle of the louvers 1110 may be controlled by the computing devices themselves. For example, a particular computing device may monitor its own temperature and may send instructions to a louver adjustment module 1512 configured to adjust the angle of the louver 1110 configured to regulate airflow through the slot 1102 in which the particular computing device is located. Accordingly, each computing device within the rack 1100 may self-regulate its temperature.

Figure 16:
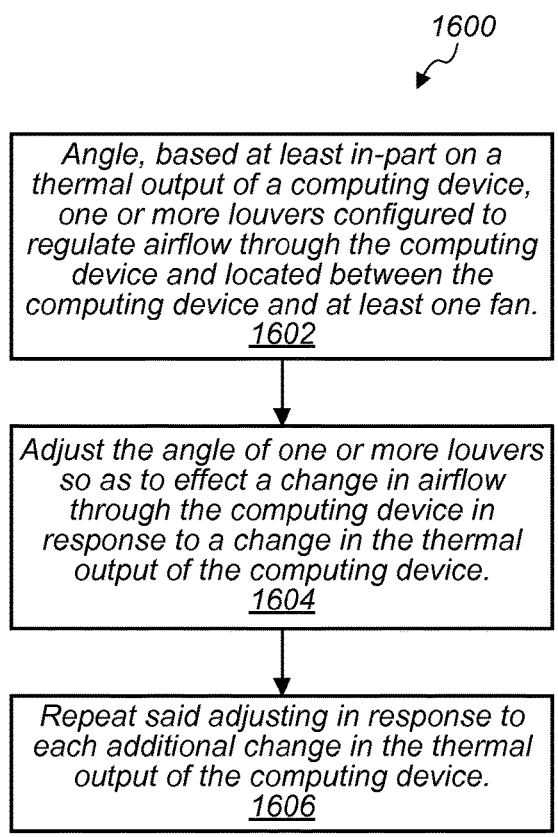
FIG. 16 illustrates a method of angling louvers, according to some embodiments.

FIG. 16 illustrates a method of regulating a temperature of a computing device, according to some embodiments. In some embodiments, the method 1600 may be implemented by or in the context of one or more systems or elements described herein. The thermal output of a computing device may, in some cases, be detected at an electric sensor positioned within the computing device or external to the computing device. At block 1602 one or more louvers configured to regulate airflow through a computing device may be angled based, at least in-part, on a thermal output of the computing device. The one or more louvers may be located between the computing device and at least one fan. Angling a louver may include angling the louver such that it is closed or vertical, including upon installation. Angling can also include placing the louver at some other angle, e.g., partially open. In some embodiments, the one or more louvers may be biased toward a position which maximally restricts airflow through the computing device.

At block 1604, the angle of one or more louvers may be adjusted so as to effect a change in airflow through the computing device in response to a change in the thermal output of the computing device. In some embodiments, the angle may be adjusted by a louver adjustment module similar to the louver adjustment module 1112 described hereinabove. Accordingly, the angle may be adjusted in response to an increase in temperature of an exhaust flow in which the louver adjustment module sits. The adjusting may be repeated, at block 1606, in response to each additional change in the thermal output of the computing device. Thus, the angle of one or more louvers may be continuously adjusted in provision of an individualized airflow through the computing device that is tailored specifically for the computing device based on the computing device's thermal output.

The method may further comprise independently regulating airflow through a different computing device within the server rack at least in part by: angling, based on a thermal output of the different computing device, one or more louvers configured to regulate airflow through the different computing device and located between the different computing device and at least one fan; adjusting the angle of one or more louvers so as to effect a change in airflow through the different computing device in response to a change in the thermal output of the different computing device; and repeating said adjusting in response to each additional change in the thermal output of the different computing device.

Figure 17:
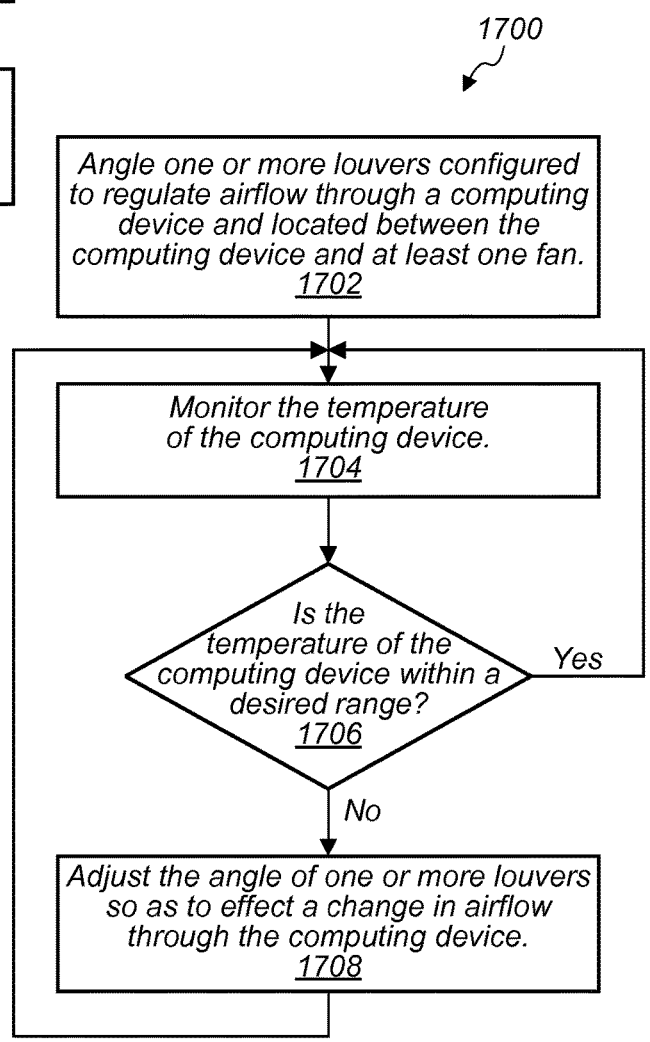
FIG. 17 illustrates a method of angling louvers, according to some embodiments.

FIG. 17 illustrates a method of regulating a temperature of a computing device, according to some embodiments. In some embodiments, the teachings of the flow diagram 1700 may be implemented by or in the context of one or more systems or elements described herein. At block 1702 one or more louvers may be angled. In some embodiments, the one or more louvers may be configured to regulate airflow through a computing device and may be located between the computing device and at least one fan. Angling a louver may include angling the louver such that it is closed or vertical, including upon installation. Angling could also include placing the louver at some other angle, e.g., partially open.

At block 1704, the temperature of the computing device may be monitored. In some embodiments, the temperature may be monitored by a system similar to the system 1500 described with reference to FIG. 15. At block 1706, a determination may be made whether or not the temperature of the computing device is within a desired range. In some embodiments, a setpoint may be substituted for a range. For example, a determination may be made whether or not the temperature of the computing device is equivalent to the setpoint, e.g., a specified operating temperature. Accordingly, in some embodiments, a setpoint may be substituted for a desired range in the following steps. The desired range may specify acceptable operating temperatures for the computing device. In some embodiments, temperature of the computing device may be measured by a sensor within the computing device or by a sensor external to the computing device. The sensor may measure temperature or may measure another metric, e.g., processor usage or workload, energy consumption, etc., from which a temperature may be estimated. If the temperature of the computing device is within the desired range then return to block 1704.

If the temperature of the computing device is not within the desired range, then proceed to block 1708 where the angle of one or more louvers may be adjusted so as to effect a change in airflow through the computing device. Following the adjustment, return to block 1704 where the temperature of the computing device may be monitored. Thus, the temperature of a computing device may be maintained within a desired range by continuously monitoring the temperature of the computing device and adjusting the angle of one or more louvers to adjust the airflow over the computing device when the temperature of the computing device goes outside the desired range.

Figure 18:
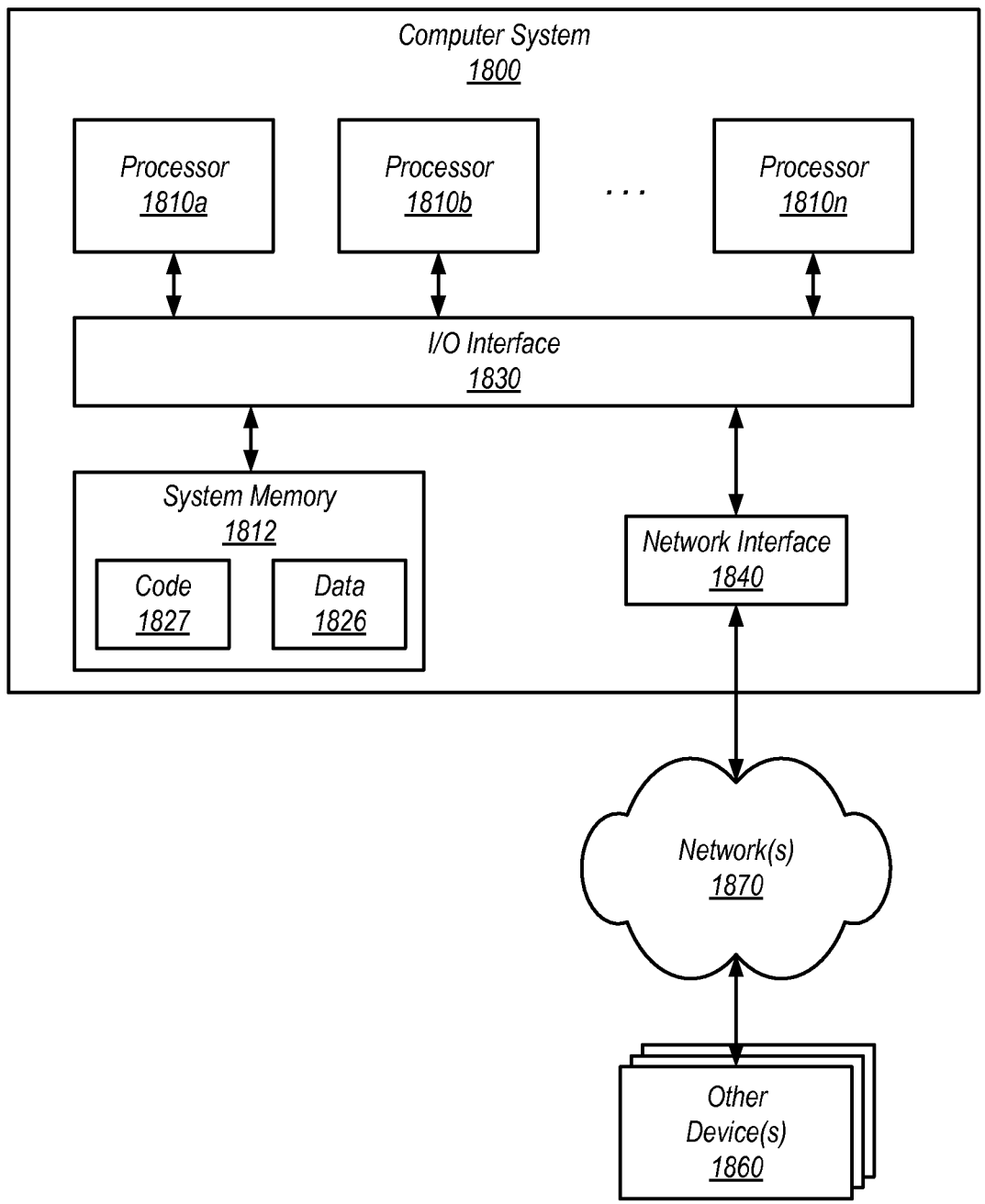
FIG. 18 illustrates a block diagram of an example computer system that may be used in some embodiments.

FIG. 18 is a block diagram illustrating an example computer system that may be used in some embodiments.

In some embodiments, a system that implements a portion or all of one or more of the technologies, including but not limited to a portion or all of the computing systems, devices, controllers, management systems, control modules, one or more modules included in the controllers described herein, may include a general-purpose computer system that includes or is configured to access one or more computer system-accessible media, such as computer system 1800 illustrated in FIG. 18. In the illustrated embodiment, computer system 1800 includes one or more processors 1810 coupled to a system memory 1820 via an input/output (I/O) interface 1830. Computer system 1800 further includes a network interface 1840 coupled to I/O interface 1830.

In various embodiments, computer system 1800 may be a uniprocessor system including one processor 1810, or a multiprocessor system including several processors 1810 (e.g., two, four, eight, or another suitable number). Processors 1810 may be any suitable processors capable of executing instructions. For example, in various embodiments, processors 1810 may be general-purpose or embedded processors implementing any of a variety of instruction set architectures (ISAs), such as the x86, PowerPC, SPARC, or MIPS ISAs, or any other suitable ISA. In multiprocessor systems, each of processors 1810 may commonly, but not necessarily, implement the same ISA.

System memory 1820 may be configured to store instructions and data accessible by processor(s) 1810. In various embodiments, system memory 1820 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of the controllers, one or more modules included in the controllers, and various sensors, systems, devices, and apparatuses as described herein, are shown stored within system memory 1820 as code 1825 and data 1826.

In some embodiments, I/O interface 1830 may be configured to coordinate I/O traffic between processor 1810, system memory 1820, and any peripheral devices in the device, including network interface 1840 or other peripheral interfaces. In some embodiments, I/O interface 1830 may perform any necessary protocol, timing or other data transformations to convert data signals from one component (e.g., system memory 1820) into a format suitable for use by another component (e.g., processor 1810). In some embodiments, I/O interface 1830 may include support for devices attached through various types of peripheral buses, such as a variant of the Peripheral Component Interconnect (PCI) bus standard or the Universal Serial Bus (USB) standard, for example. In some embodiments, the function of I/O interface 1830 may be split into two or more separate components, such as a north bridge and a south bridge, for example. Also, in some embodiments some or all of the functionality of I/O interface 1830, such as an interface to system memory 1820, may be incorporated directly into processor 1810.

Network interface 1840 may be configured to allow data to be exchanged between computer system 1800 and other devices 1860 attached to a network or networks 1850, such as other computer systems or devices, management systems, control modules, etc., as illustrated in FIGS. 1 through 17. In various embodiments, network interface 1840 may support communication via any suitable wired or wireless general data networks, such as types of Ethernet network, for example. Additionally, network interface 1840 may support communication via telecommunications/telephony networks such as analog voice networks or digital fiber communications networks, via storage area networks such as Fibre Channel SANs, or via any other suitable type of network and/or protocol.

In some embodiments, system memory 1820 may be a computer system-accessible medium configured to store program instructions and data for implementing embodiments of controllers as described above relative to FIGS. 1-17, e.g., the control module 1508. In other embodiments, program instructions and/or data may be received, sent or stored upon different types of computer-accessible media. Generally speaking, a computer system-accessible medium may include non-transitory storage media or memory media such as magnetic or optical media, e.g., disk or DVD/CD coupled to computer system 1800 via I/O interface 1830. A non-transitory computer system-accessible storage medium may also include any volatile or non-volatile media such as RAM (e.g. SDRAM, DDR SDRAM, RDRAM, SRAM, etc.), ROM, etc., that may be included in some embodiments of computer system 1800 as system memory 1820 or another type of memory. Further, a computer-accessible medium may include transmission media or signals such as electrical, electromagnetic, or digital signals, conveyed via a communication medium such as a network and/or a wireless link such as may be implemented via network interface 1840.

Various embodiments may further include receiving, sending or storing instructions and/or data implemented in accordance with the foregoing description upon a computer-accessible medium. Generally speaking, a computer system-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A server rack, comprising:
    a plurality of slots within the server rack,
    a plurality of computing devices, wherein individual ones of the computing devices are mounted within individual ones of the slots, and
    a plurality of slot-level thermal regulation systems each comprising a body mounted between one or more shelves that support one or more respective computing devices and a wall of the server rack, each body configured to isolate air flow exiting the computing devices from air flow exiting other computing devices based on channeling the isolated air flow from the respective shelf through the respective body before exiting the server rack, wherein at least one of the slot-level thermal regulation systems comprises:
        a louver coupled to the body and corresponding to a particular slot and located between a particular computing device mounted within the particular slot and at least one fan configured to facilitate airflow through the server rack, wherein the louver is configured to regulate airflow through the particular computing device, and
        a thermally activated unit located in an exhaust flow of the particular computing device, wherein the thermally activated unit is configured to change an angle of the louver in response to a change in temperature of the exhaust flow.

2. The server rack of claim 1, wherein the server rack comprises at least a first slot-level thermal regulation system and a second slot-level thermal regulation system, wherein the first slot-level thermal regulation system is configured to regulate a temperature of a first computing device and the second slot-level thermal regulation system is configured to independently regulate a temperature of a second computing device.

3. The server rack of claim 1, wherein the thermally activated unit comprises a material configured to change its dimensions in response to a change in temperature of the exhaust flow, wherein the thermally activated unit is configured such that a change in dimension of the material changes the angle of the louver.

4. The server rack of claim 1, wherein the louver is configured such that airflow through the computing device increases as the louver is opened and decreases as the louver is closed.

5. The server rack of claim 1, wherein the at least one fan facilitates airflow through two or more slots of the server rack.

6. A slot-level thermal regulation system configured to mount within a server rack, comprising:
    a body for mounting between one or more of a plurality of shelves configured to support one or more of a plurality of computing devices and a wall of the server rack such that air exiting a channel at least partially defined by a shelf supporting one or more of the computing devices flows through, and is isolated from other air exiting other computing devices in the rack by, the respective body before exiting the server rack;
    one or more louvers coupled to the body and configured to regulate airflow through a computing device mounted within a slot at least partially defined by a shelf of the shelves within the server rack; and
    an actuator configured to regulate a temperature of the computing device within the slot at least in part by altering an angle of at least one louver of the one or more louvers configured to regulate airflow through the computing device.

7. The thermal regulation system of claim 6, further comprising:
    an electrically powered control module configured to:
        monitor a parameter of the computing device, and
        operate the actuator to alter the angle of the at least one louver in response to a change in the parameter.

8. The thermal regulation system of claim 7, wherein the parameter comprises one of: a temperature of the computing device, a power consumption of the computing device, or a processor workload.

9. The thermal regulation system of claim 6, wherein the actuator comprises a bimetallic unit comprising two metals having different thermal expansion coefficients, wherein the bimetallic unit is configured to alter the angle of at least one louver of the one or more louvers in response to a change in temperature of the airflow through the computing device.

10. The thermal regulation system of claim 9, wherein the actuator is configured to respond to changes in thermal energy emitted by the computing device such that both expansion of the actuator and contraction of the actuator alter the angle of at least one louver of the one or more louvers.

11. The thermal regulation system of claim 6, wherein the actuator comprises a memory metal configured to maintain a first position at temperatures below a temperature threshold and to maintain a second position at temperatures equal to or greater than the temperature threshold.

12. The thermal regulation system of claim 6, further comprising:
    a capillary thermostat comprising:
        a bulb with a material configured to increase in volume in response to an increase in thermal energy contained therein,
        a capillary in fluid communication with the bulb, and
        a diaphragm connected to the actuator and biased to a contracted position, wherein the diaphragm is configured to expand in response to an increase in volume of the material contained in the bulb and to contract in response to a decrease in volume of the material contained in the bulb.

13. The thermal regulation system of claim 6, further comprising:
    a wax motor configured to power the actuator, comprising:
        a chamber with a wax contained therein, and
        a piston coupled to the actuator,
    wherein a change in dimension of the wax is configured to effect a change in the position of the piston, and
    wherein the change in position of the piston is configured to effect a change in position of the actuator.

14. The thermal regulation system of claim 6, wherein at least one louver is perforated to allow at least some airflow, simulating an airflow impedance of an installed server when the at least one louver is angled to maximally restrict airflow.

15. The thermal regulation system of claim 6, wherein the one or more louvers comprises at least one louver per ½U of rack height.

16. The thermal regulation system of claim 6, further comprising:
a cooling canister configured to:
mount in a space in the rack downstream from an exhaust end of the computing device, wherein the cooling canister is configured to couple with a subset of a plurality of computing devices mounted in the rack, wherein the subset of the plurality of computing devices includes the computing device,
wherein the cooling canister comprises:
one or more fans mounted to the cooling canister, wherein the one or more fans are configured to draw air through the subset of the plurality of computing devices; and
a sealing surface configured to substantially seal against respective exhaust ends of the subset of the plurality of computing devices, such that air drawn into the cooling canister flows through the subset of the plurality of computing devices without being drawn into the cooling canister from one or more other computing devices of the plurality of computing devices in the rack.

17. A method of regulating airflow through a computing device within a server rack, comprising:
angling, based at least in-part on a thermal output of the computing device, one or more louvers coupled to a body mounted between a shelf that supports the computing device and a wall of the server rack such that air exiting the device is isolated, by the body, from other air flows exiting other computing device in the rack before exiting the server rack, the one or more louvers configured to regulate airflow through the computing device and located in airflow between the computing device and at least one fan;
adjusting the angle of the one or more louvers so as to effect a change in airflow through the computing device in response to a change in the thermal output of the computing device; and
repeating said adjusting in response to an additional change in the thermal output of the computing device.

18. The method of claim 17, further comprising:
detecting, at an electric sensor positioned within the computing device, the thermal output of the computing device.

19. The method of claim 17, further comprising:
independently regulating airflow through a different computing device within the server rack at least in part by:
angling, based on a thermal output of the different computing device, one or more louvers configured to regulate airflow through the different computing device and located between the different computing device and at least one fan;
adjusting the angle of one or more louvers so as to effect a change in airflow through the different computing device in response to a change in the thermal output of the different computing device; and
repeating said adjusting in response to an additional change in the thermal output of the different computing device.

20. The method of claim 17, further comprising:
biasing the one or more louvers toward a position which maximally restricts airflow through the computing device.

* * * * *